US011277108B1

(12) United States Patent
Ibrahim et al.

(10) Patent No.: US 11,277,108 B1
(45) Date of Patent: Mar. 15, 2022

(54) VARIABLE GAIN AMPLIFIERS WITH CROSS-COUPLE SWITCHING ARRANGEMENTS

(71) Applicant: Analog Devices International Unlimited Company, Limerick (IE)

(72) Inventors: Yahia Z. M. Ibrahim, Giza (EG); Mohamed Ahmed Youssef Abdalla, Cairo (EG)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/135,324

(22) Filed: Dec. 28, 2020

(51) Int. Cl.
*H03G 3/30* (2006.01)
*H03F 3/45* (2006.01)

(52) U.S. Cl.
CPC ....... *H03G 3/3036* (2013.01); *H03F 3/45264* (2013.01); *H03F 3/45269* (2013.01); *H03G 2201/103* (2013.01); *H03G 2201/307* (2013.01)

(58) Field of Classification Search
CPC .................................................. H03G 3/3036
See application file for complete search history.

(56) References Cited

U.S. PATENT DOCUMENTS

| 5,481,225 | A | 1/1996 | Lumsden et al. |
| 6,011,437 | A | 1/2000 | Sutardja et al. |
| 6,218,899 | B1 | 4/2001 | Ezell |
| 6,545,534 | B1 | 4/2003 | Mehr |
| 6,577,188 | B2 | 6/2003 | Ueno et al. |
| 7,990,217 | B2 | 8/2011 | Gilbert et al. |
| 7,990,218 | B2 | 8/2011 | Jones |
| 8,698,560 | B2 * | 4/2014 | Li ............................ H03F 3/211 |
|  |  |  | 330/254 |
| 9,647,618 | B1 * | 5/2017 | Yuan .................... H03G 1/0023 |
| 2003/0169089 | A1 * | 9/2003 | Manku ................. H03D 7/1441 |
|  |  |  | 327/359 |

(Continued)

OTHER PUBLICATIONS

Min et al., *Ka-Band SiGe HBTLow Phase Imbalance Differential 3-Bit Variable Gain LNA*, IEEE Microwave and Wireless Components Letters, vol. 18, No. 4, Apr. 2008, 3 pages.

(Continued)

*Primary Examiner* — Patricia T Nguyen
(74) *Attorney, Agent, or Firm* — Patent Capital Group

(57) ABSTRACT

An example VGA includes a transistor arrangement having a plurality of transistors configured to realize one or more gain step circuits of the VGA, and a cross-couple switching arrangement having a plurality of switches configured to selectively change the coupling of the terminals of at least some of the transistors depending on whether a given gain step circuit is supposed to be in an ON state or in an OFF state. Using the cross-couple switching arrangement advantageously allows keeping all of the transistors ON at all times during operation and changing the coupling of some transistor terminals to either realize an in-phase addition of currents flowing through various transistors to apply the maximum gain or realize a subtraction of currents to apply the minimum gain. Such a VGA may be inherently wideband, enabling a highly linear, wideband operation without having to resort to significant trade-offs with other performance parameters.

24 Claims, 8 Drawing Sheets

(56) References Cited

U.S. PATENT DOCUMENTS

| | | | | |
|---|---|---|---|---|
| 2007/0290757 | A1* | 12/2007 | Gilbert | H03F 1/3211 |
| | | | | 330/278 |
| 2009/0239592 | A1* | 9/2009 | Deng | H04B 1/16 |
| | | | | 455/574 |
| 2012/0062307 | A1* | 3/2012 | Oliaei | H03K 17/165 |
| | | | | 327/427 |
| 2019/0379340 | A1* | 12/2019 | Rattan | H03F 3/45475 |
| 2020/0176374 | A1* | 6/2020 | Tanaka | H01L 21/823475 |

OTHER PUBLICATIONS

Tang et al., *A Highly Linear CMOS Amplifier for Variable Gain Amplifier Applications*, Department of Electrical and Computer Engineering, Iowa State University, Ames, IA 50011, 4 pages.

Yi et al., *A Ka-band C<MOS Digital-Controlled Phase-Invariant Variable Gain Amplifier with 4-bit Tuning Range and 0.5-dB Resolution*, 2018 IEEE Radio Frequency Integrated Circuits Symposium, 4 pages.

Gerstenhaber et al., *Adjustable-Gain Difference Amplifier Circuit Measures Hundres of Volts, Rejects Large Common-Mode Signals*, Analog Dialogue 43-12 Back Burner, Dec. 2009, 2 pages.

*Activity: Variable Gain Amplifiers*, http://wiki.analog.com/university/courses/electronics/electronics-lab-variable-gain-amplifier, downloaded Dec. 16, 2020, 8 pages.

* cited by examiner

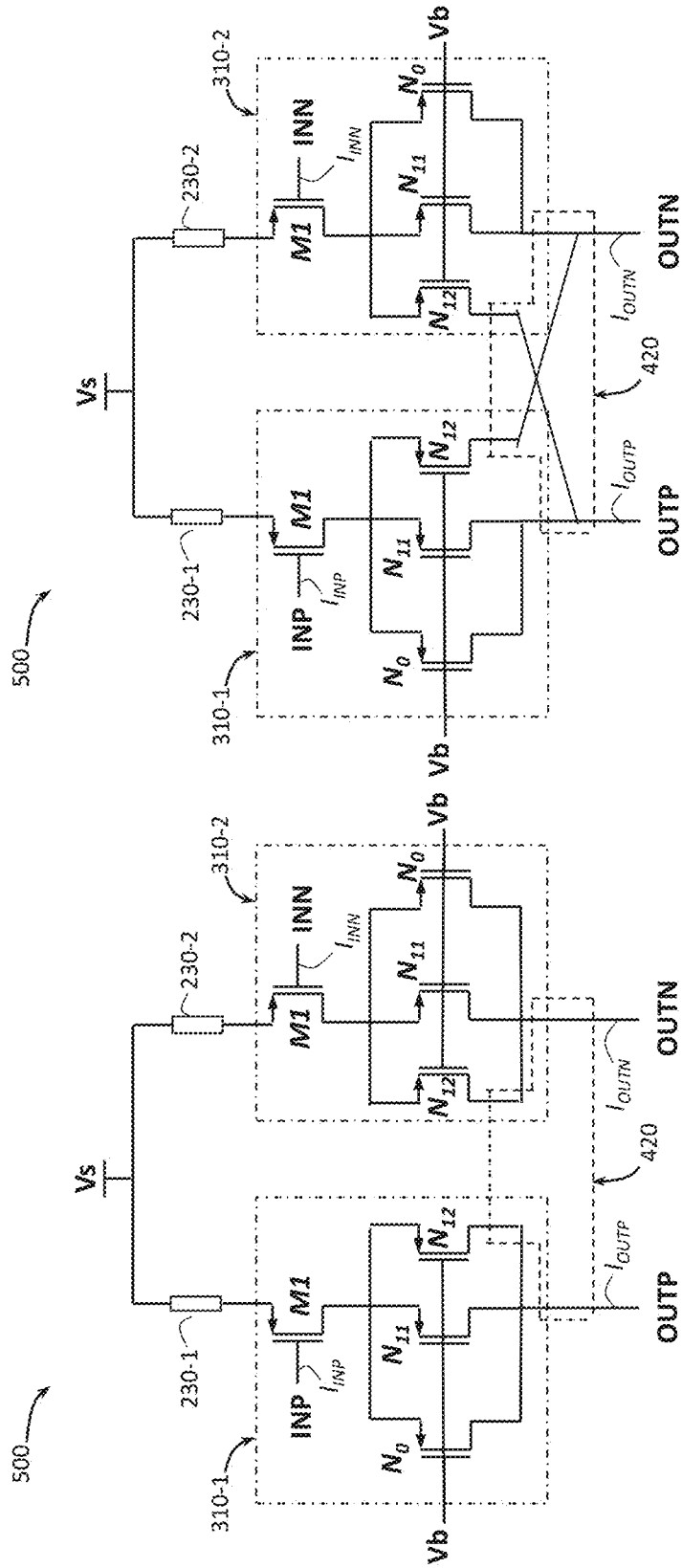

VARIABLE GAIN AMPLIFIERS WITH CROSS-COUPLE SWITCHING ARRANGEMENTS

TECHNICAL FIELD OF THE DISCLOSURE

The present disclosure generally relates to electronic devices and, more particularly, to variable gain amplifiers.

BACKGROUND

A variable gain amplifier (VGA) is an electronic amplifier that varies its gain depending on a control voltage. VGAs have many applications, including radio frequency (RF) communications, ultrasound, radar, remote sensing, audio compression, amplitude modulation, and synthesizers.

One desirable characteristic of a VGA is the ability of the VGA to maintain a substantially constant phase response across a wide range of gain values. Achieving this behavior in real-life VGAs is far more complicated and many challenges to the ability to maintain a constant phase response must be resolved, often at the expense of some other performance parameter, such as gain, bandwidth, or noise. A variety of factors can affect the cost, quality and robustness of a VGA. Physical constraints such as space/surface area and also regulations can pose further constraints to the requirements or specifications of a VGA. Thus, trade-off and ingenuity have to be exercised and improvements in providing VGAs that can maintain a substantially constant phase response across a wide range of gain values are always desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 5A and 5B provide electric circuit diagrams of, respectively, an ON state and an OFF state of a VGA with a transistor arrangement implemented using P-type transistors and a cross-couple switching arrangement implemented on the output side, according to some embodiments of the present disclosure;

DESCRIPTION OF EXAMPLE EMBODIMENTS OF THE DISCLOSURE

Overview

Figure 1:
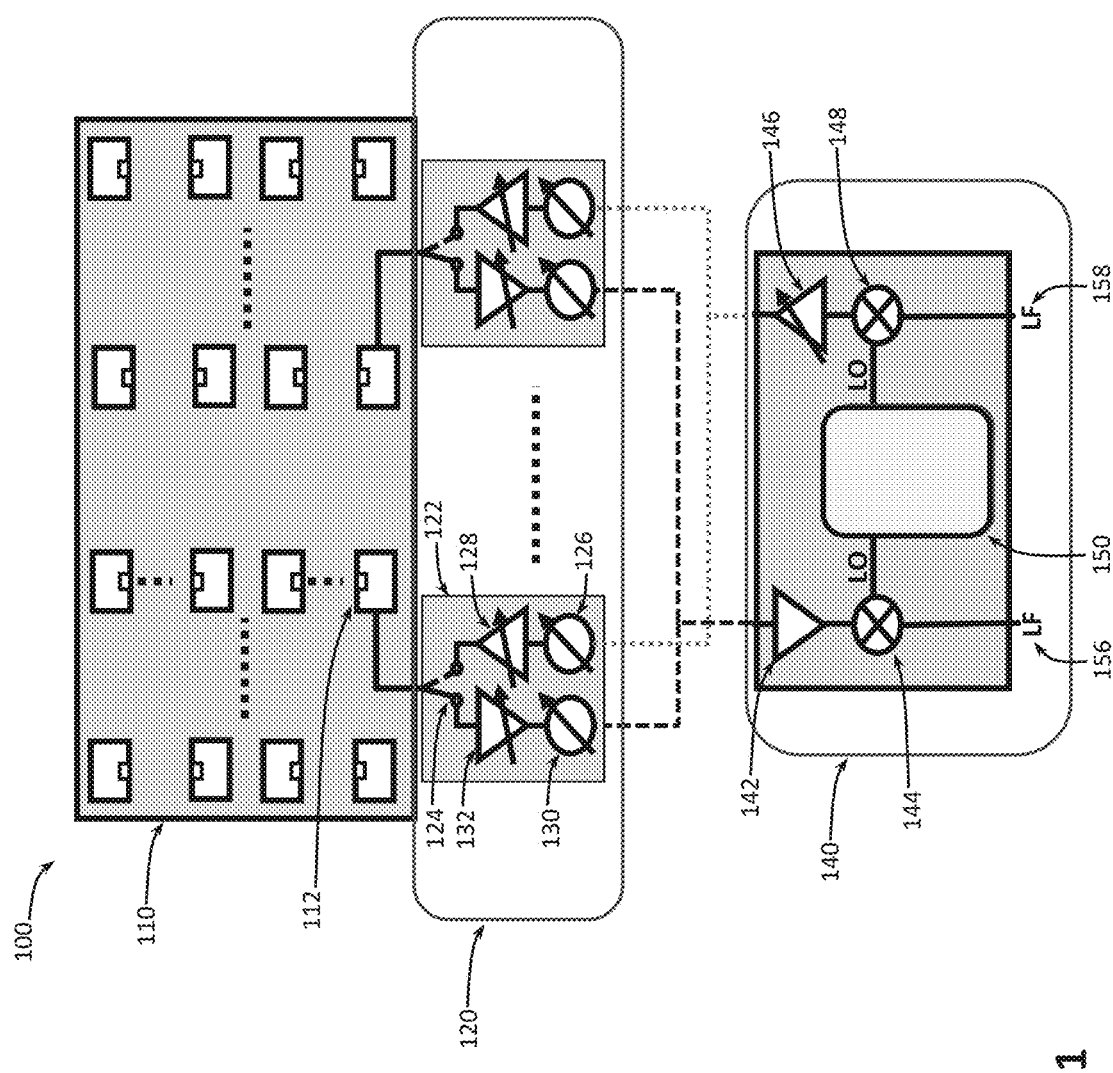
FIG. 1 provides a schematic illustration of an antenna apparatus in which with one or more VGAs with cross-couple switching arrangements may be implemented, according to some embodiments of the present disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating VGAs with cross-couple switching arrangements, proposed herein, it might be useful to first understand phenomena that may come into play in systems that use VGAs. The following foundational information may be viewed as a basis from which the present disclosure may be properly explained. Such information is offered for purposes of explanation only and, accordingly, should not be construed in any way to limit the broad scope of the present disclosure and its potential applications.

As mentioned above, VGAs may be used in a wide variety of applications. For example, VGAs may be used in radio systems. In general, radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example.

In context of wireless radio systems, an antenna is a device that serves as an interface between radio waves propagating wirelessly through space and electric currents moving in metal conductors used with a transmitter or a receiver. During transmission, a radio transmitter may supply an electric current to antenna's terminals, and the antenna may radiate the energy from the current as radio waves. During reception, an antenna may intercept some of the power of a wireless radio wave in order to produce an electric current at its terminals, which current may subsequently be amplified by the receiver. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased array antennas (also commonly referred to as "phased arrays") generally refer to a collection of antennas (where individual antennas are commonly referred to as "antenna elements") that are used to focus electromagnetic energy in a particular direction, thereby creating a main beam. Phased arrays offer numerous advantages over single-antenna systems, such as high gain, ability to perform directional steering, and simultaneous communication. Therefore, phased arrays are being used more frequently in a myriad of different applications, such as in mobile technology, cellular telephone and data, Wi-Fi technology, automotive radars, and airplane radars.

Each individual antenna element of a phased array may radiate in a spherical pattern, but, collectively, a plurality of such antenna elements may generate a wavefront in a particular direction (such a wavefront commonly referred to as a "main beam") through constructive and destructive interference. Namely, by carefully controlling the phase of signals wirelessly transmitted by different antenna elements, radiation patterns of different antenna elements may constructively interfere in a desired direction, creating the main beam in that direction, while interfering destructively in several other directions other than the direction of the main beam. Therefore, a phased array typically includes phase shift modules (also commonly referred to as "phase shifters"), configured to control the phase of signals radiated by different antenna elements.

In a phased array as described above, the precision of the direction of the main beam is highly dependent on the precision of the relative phase between different antenna elements. Unfortunately, careful control of the phase of signals radiated by different antenna elements is not a trivial task and phase errors may arise due to different reasons. Phase errors may result in deviations of the direction of the main beam from the target direction, which may significantly affect operation of a phased array, e.g., leading to degraded gain and linearity performance. One reason that makes careful phase control challenging is that VGAs used in a phased array for power control and gain calibration due to process variations and mismatches may introduce phase errors if they do not have a constant phase response across a wide range of gain values. The challenges become more severe if a VGA is used close to the end of the receiver chain of a phased array, where it may become the dominant contributor to receiver nonlinearities. The challenges are exacerbated even further for millimeter-wave (mm-wave) spectrum of $5^{th}$ generation (5G) wireless communication systems because as the frequency of operation of the VGAs increases it becomes more difficult to achieve constant phase response and when VGAs are implemented using transistors of sub-micron complementary metal-oxide-semiconductor (CMOS) technologies because such transistors have lower breakdown voltages which limits the achievable linearity of VGAs.

VGA architectures that have been used in the past do not always exhibit sufficiently low phase errors across different gain states, especially at mm-wave frequencies. Conventional techniques that have been used in the past to minimize a phase error across gain states typically require trade-offs between gain, bandwidth, linearity, and noise of a VGA. Furthermore, these techniques commonly rely on implementing additional circuit components such as resistors, which has the downside of making them less immune to process variations and mismatches. Still further, conventional techniques often require large voltage swings across some circuit components, making them less suitable for deep sub-micron CMOS technologies.

Various embodiments of the present disclosure provide systems and methods that aim to improve on one or more of the above-described challenges by providing VGAs with cross-couple switching arrangements. In one aspect of the present disclosure, an example VGA is configured to receive a differential input signal and provide an output signal based on the differential input signal and the target gain. The VGA includes a transistor arrangement and a cross-couple switching arrangement. The transistor arrangement includes a plurality of transistors, configured to form one or more gain step circuits of the VGA, and the cross-couple switching arrangement includes a plurality of switches, configured to selectively change the coupling of terminals of at least some of the transistors depending on whether a given gain step circuit is supposed to be in an ON state (i.e., applying the maximum gain of the gain step circuit to generate the output signal from the stage) or in an OFF state (i.e., applying the minimum gain of the gain step circuit to generate the output signal from the stage). Suitable control signals may be used to provide to the cross-couple switching arrangement an indication as to whether a given gain step circuit is supposed to be in an ON state or an OFF state. Using the cross-couple switching arrangement advantageously allows keeping all of the transistors ON (i.e., allowing the transistors of the gain step circuits to conduct current) at all times during operation of the VGA and changing the coupling of some transistor terminals to realize/achieve either an in-phase addition of the currents flowing through various transistors to apply the maximum gain of a given gain step circuit or an in-phase subtraction of the currents to apply the minimum gain of that gain step circuit. Such a VGA may be inherently wideband as it may guarantee a substantially constant capacitance at all VGA nodes regardless of the gain states of different gain step circuits, enabling a highly linear, wideband operation without having to resort to significant trade-offs with other performance parameters to achieve constant phase response. These and other advantages will become clear from further descriptions of various embodiments of VGAs with cross-couple switching arrangements presented herein.

Some of the descriptions of VGAs with cross-couple switching arrangements are provided herein with reference to wireless communication technologies and, in particular, to phased arrays, because this is where such VGAs may be particularly useful, especially for mm-wave spectrum of 5G communication systems and/or for transistors implemented using deep sub-micron technologies. However, in general, various embodiments of VGAs with cross-couple switching arrangements as described herein, are applicable to 5G communication systems operating at frequencies other than mm-wave frequencies (e.g., for sub-6 GHz frequency spectrum), to wireless communication systems of technologies other than 5G (e.g., Long Term Evolution (LTE) systems), as well as to systems other than wireless communication systems (e.g., cable communication systems, ultrasound, radar, remote sensing, audio compression, amplitude modulation, and synthesizers).

The exact design of VGAs with cross-couple switching arrangements, described herein, may be realized in many different ways, all of which being within the scope of the present disclosure.

In one example of design variations according to various embodiments of the present disclosure, a choice can be made, individually for each of the transistors of the transistor arrangement of a given VGA with a cross-couple switching arrangement, to employ field-effect transistors (FETs), e.g., metal-oxide-semiconductor (MOS) technology transistors (e.g., where various transistors may be N-type MOS (NMOS) or P-type MOS (PMOS) transistors), bipolar junction transistors (BJTs) (e.g., where various transistors may be NPN or PNP transistors), or a combination of one or more FETs and one or more BJTs. In view of that, in the following descriptions, transistors of the transistor arrangements of VGAs presented herein are sometimes described with reference to their first, second, and third terminals. The term "first terminal" of a transistor is used to refer to a collector terminal if the transistor is a BJT or to a drain terminal if the transistor is a FET, the term "second terminal" of a transistor is used to refer to an emitter terminal if the transistor is a BJT or to a source terminal if the transistor is a FET, and the term "third terminal" of a transistor is used to refer to a base terminal if the transistor is a BJT or to a gate terminal if the transistor is a FET. These terms remain the same irrespective of whether a transistor of a given technology is an N-type transistor (e.g., an NPN transistor if the transistor is a BJT or an NMOS transistor if the transistor is a FET) or a P-type transistor (e.g., a PNP transistor if the transistor is a BJT or a PMOS transistor if the transistor is a FET).

In another example, in various embodiments, a choice can be made, whether various transistors of the transistor arrangement of a given VGA with a cross-couple switching arrangement are implemented as N-type transistors (e.g., NMOS or NPN transistors) or as P-type transistors (e.g., PMOS or PNP transistors). Although N-type transistors may be inherently faster than P-type transistors, P-type transistors may have other advantages in some deployment scenarios. In yet other examples of design variations, in various embodiments, a choice can be made as to what type of transistor architecture to employ. For example, any of the transistors of the transistor arrangements described herein that are implemented as FETs may be planar transistors or may be non-planar transistors such as FinFETs, nanowire transistors or nanoribbon transistors.

In some embodiments, one or more switches of the cross-couple switching arrangements of the VGAs described herein may be implemented as transistors. In such embodiments, one or more of the design variations described above with reference to the transistors of the transistor arrangement of a VGA may also be applicable to the transistors of the cross-couple switching arrangement of a VGA.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations. The innovations described herein can be embodied in a multitude of different ways, for example, as defined and covered by the claims or select examples.

In the following description, reference is made to the accompanying drawings, where like reference numerals or reference letters can indicate identical or functionally similar elements. For convenience, if a collection of drawings designated with different letters are present, e.g., FIGS. 2A-2B, such a collection may be referred to herein without the letters, e.g., as "FIG. 2."

The drawings show, by way of illustration, embodiments that may be practiced. It is to be understood that other embodiments may be utilized, and structural or logical changes may be made without departing from the scope of the present disclosure. For example, elements illustrated in the drawings are not necessarily drawn to scale. Moreover, certain embodiments can include more elements than illustrated in a drawing and/or a subset of the elements illustrated in a drawing. Further, some embodiments can incorporate any suitable combination of features from two or more drawings. Therefore, the following detailed description of the drawings is not to be taken in a limiting sense.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a VGA circuit 200 shown in FIGS. 2A-2B may be referred to in the present descriptions as a "VGA 200," etc.). If used, the terms "substantially," "approximately," "about," etc., may be used to generally refer to being within +/−20% of a target value, e.g., within +/−10% of a target value, based on the context of a particular value as described herein or as known in the art.

As will be appreciated by one skilled in the art, various aspects of the present disclosure, in particular aspects of VGAs with cross-couple switching arrangements as described herein, may be embodied in various manners— e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g., one or more microprocessors, of one or more computers. In various embodiments, different steps, and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g., to various components and arrangements of components of RF devices or phased array systems, and/or their controllers, etc.) or be stored upon manufacturing of these devices and systems.

Example Antenna Apparatus

FIG. 1 provides a schematic illustration of an antenna apparatus 100, e.g., a phased array system/apparatus, in which with one or more VGAs with cross-couple switching arrangements may be implemented, according to some embodiments of the present disclosure. As shown in FIG. 1, the system 100 may include an antenna array 110, a beamformer array 120, and an up-and-down converter (UDC) circuit 140.

In general, the antenna array 110 may include one or more, typically a plurality of, antenna elements 112 (only one of which is labeled with a reference numeral in FIG. 1 in order to not clutter the drawing). In various embodiments, the antenna elements 112 may be radiating elements or passive elements. For example, the antenna elements 112 may include dipoles, open-ended waveguides, slotted waveguides, microstrip antennas, and the like. In some embodiments, the antenna elements 112 may include any suitable elements configured to wirelessly transmit and/or receive RF signals. Although some embodiments shown in the present drawings illustrate a certain number of antenna elements 112, it is appreciated that these embodiments may be implemented with an array of any number of two or more antenna elements. Furthermore, although the disclosure may discuss certain embodiments as one type of antenna array, it is understood that the embodiments disclosed herein may be implemented with different types of antenna arrays, such as time-domain beamformers, frequency-domain beamformers, dynamic antenna arrays, antenna arrays, passive antenna arrays, and the like.

Similarly, the beamformer array 120 may include one or more, typically a plurality of, beamformers 122 (only one of which is labeled with a reference numeral in FIG. 1 in order to not clutter the drawing). The beamformers 122 may be seen as transceivers (e.g., devices which may transmit and/or receive signals, in this case—RF signals) that feed to antenna elements 112. In some embodiments, a single beamformer 122 of the beamformer array 120 is associated with a single antenna element 112 of the antenna array 110 in a one-to-one correspondence (i.e., different beamformers 122 are associated with different antenna elements 112). In other embodiments, more than one beamformers 122 may be associated with a single antenna element 112, e.g., two beamformers 122 may be associated with a single antenna element 112 if, e.g., such antenna element is a dual polarization antenna element.

In some embodiments, each of the beamformers 122 may include a switch 124 to switch the path from the corresponding antenna element 112 to the receiver or the transmitter path. Although not specifically shown in FIG. 1, in some embodiments, each of the beamformers 122 may also include another switch to switch the path from a signal processor (also not shown) to the receiver or the transmitter path. As shown in FIG. 1, in some embodiments, the transmitter (TX) path of each of the beamformers 122 may include a phase shifter 126 and an amplifier 128, while the receiver (RX) path may include a phase adjusted 130 and an amplifier 132. The phase shifter 126 may be configured to adjust the phase of the RF signal to be transmitted (TX signal) by the antenna element 112 and the amplifier 128 may be configured to adjust the amplitude of the TX signal to be transmitted by the antenna element 112. Similarly, the phase shifter 130 and the amplifier 132 may be configured to adjust the RF signal received (RX signal) by the antenna element 112 before providing the RX signal to further circuitry, e.g., to the UDC circuit 140, to the signal processor (not shown), etc. The beamformers 122 may be considered to be "in the RF path" of the antenna apparatus 100 because the signals traversing the beamformers 122 are RF signals (i.e., TX signals which may traverse the beamformers 122 are RF signals upconverted by the UDC circuit 140 from lower frequency, e.g., from intermediate frequency (IF) or from baseband, while RX signals which may traverse the beamformers 122 are RF signals which have not yet been downconverted by the UDC circuit 140 to lower frequency, e.g., to IF or to baseband).

Although a switch is shown in FIG. 1 to switch from the transmitter path to the receive path (i.e., the switch 124), in other embodiments of the beamformer 122, other components can be used, such as a duplexer. Furthermore, although FIG. 1 illustrates an embodiment where the beamformers 122 include the phase shifters 126, 130 (which may also be referred to as "phase adjusters") and the amplifiers 128, 132, in other embodiments, any of the beamformers 122 may include other components to adjust the magnitude and/or the phase of the TX and/or RX signals. In yet further embodiments, one or more of the beamformers 122 may not include the phase shifter 126 and/or the phase shifter 130 because the desired phase adjustment may, alternatively, be performed in other portions of the RX or TX paths (e.g., in the digital domain).

Turning to the details of the UDC circuit, in general, the UDC circuit 140 may include an upconverter and/or downconverter circuitry, i.e., in various embodiments, the UDC circuit 140 may include 1) an upconverter circuit but no downconverter circuit, 2) a downconverter circuit but no upconverter circuit, or 3) both an upconverter circuit and a downconverter circuit. As shown in FIG. 1, the downconverter circuit of the UDC circuit 140 may include an amplifier 142 and a mixer 144, while the upconverter circuit of the UDC circuit 140 may include an amplifier 146 and a mixer 148.

In some embodiments, a single UDC circuit 140 may provide upconverted RF signals to and/or receive RF signals from any one of the beamformers 122. Thus, a single UDC circuit 140 may be associated with a plurality of beamformers 122 of the beamformer array 120 (e.g., there may be 48 beamformers 122 in the beamformer array 120, associated with 48 antenna elements 112 of the antenna array 110). This is schematically illustrated in FIG. 1 with a dashed line and a dotted line connecting various elements of the beamformer array 120 and the UDC circuit 140. Namely, FIG. 1 illustrates that the dashed line connects the downconverter circuit of the UDC circuit 140 (namely, the amplifier 142) to the RX paths of two different beamformers 122, and that the dotted line connects the upconverter circuit of the UDC circuit 140 (namely, the amplifier 146) to the TX paths of two different beamformers 122.

The mixer 144 in the RX path of the UDC circuit 140 may have [at least] two input terminals and one output terminal. The two inputs of the mixer 144 include an input from the amplifier 142 and an input from a local oscillator (LO) 150. The mixer 144 may be configured to receive, at one of its input terminals, an RF RX signal from the RX path of one of the beamformers 122, after it has been amplified by the amplifier 142, and receive, at another one of its input terminals, an LO signal from the LO 150 and mix these two input signals to downconvert the RF RX signal to a lower frequency (LF), generating an LF RX signal 156 (e.g., the LF RX signal may be an IF or a baseband signal). Thus, the mixer 144 in the RX path of the UDC circuit 140 may be referred to as a "downconverting mixer." The LF RX signal 156 may be output by the mixer 144 from its output terminal.

Similarly, the mixer 148 in the TX path of the UDC circuit 140 may have [at least] two input terminals and one output terminal. The two inputs of the mixer 148 include an input from the LO 150 and an LF TX signal 158 (i.e., a TX signal at a lower frequency, e.g., the LF TX signal 158 may be an IF or a baseband signal). The one output of the mixer 148 is an output to the amplifier 146. The mixer 148 may be configured to receive an LF TX signal 158 at its first input terminal and receive an LO signal from the LO 150 at its second input and mix these two signals to upconvert the LF TX signal 158 to the desired RF frequency, producing an upconverted RF TX signal to be provided, after it has been amplified by the amplifier 146, to the TX path of one of the beamformers 122. Thus, the mixer 148 in the TX path of the UDC circuit 140 may be referred to as a "upconverting mixer." The upconverted RF TX signal may be output by the mixer 148 from its output terminal.

As is known in communications and electronic engineering, an IF is a frequency to which a carrier signal may be shifted as an intermediate step in transmission or reception. An IF signal is created by mixing a carrier signal with an LO signal of a suitable frequency in a process called heterodyning, resulting in a signal at the difference or beat frequency. Conversion to IF may be useful for several reasons. One reason is that, when several stages of filters are used, they can all be set to a fixed frequency, which makes them easier to build and to tune. Another reason is that lower frequency transistors generally have higher gains so fewer stages may be required. Yet another reason is to improve frequency selectivity because it may be easier to make sharply selective filters at lower fixed frequencies.

It should also be noted that, while some descriptions provided herein refer to signals 156 and 158 as IF signals, these descriptions are equally applicable to embodiments where signals 156 and 158 are baseband signals. In such embodiments, frequency mixing of the mixers 144 and 148 may be a zero-IF mixing (also referred to as a "zero-IF conversion") in which an LO signal used to perform the mixing (i.e., the LO signal generated by the LO 150) may have a center frequency in the band of RF RX/TX frequencies. It should also be noted that although a single LO is shown in FIG. 1 (i.e., the LO 150) as providing LO signals to the RX path mixer 144 and the TX path mixer 148, in some embodiments, separate LOs may be used in the RX and in the TX paths. For example, for frequency-division duplex (FDD) implementations, LO signals of different frequencies may be used by the RX path mixer 144 and the TX path mixer 148 to, respectively, downconvert and upconvert signals between RF and LF.

In some embodiments, one or both amplifiers 142, 146 may be a VGA, and one or both amplifiers 142, 146 may be implemented as a VGA with a cross-couple switching arrangement as described herein. In such embodiments, implementing the amplifier 142 as a VGA may be particularly beneficial since the amplifier 142 may be the last block in the receiver chain and, therefore, has particularly high linearity requirements. In some such embodiments, the amplifier 132 may be a low-noise amplifier (LNA) while the amplifier 128 may be a power amplifier (PA).

In other embodiments, one or both amplifiers 132, 128 may be a VGA, and one or both of the amplifiers 132, 128 may be implemented as a VGA with a cross-couple switching arrangement as described herein. In some such embodiments, the amplifier 142 may be an LNA while the amplifier 146 may be a PA.

Although not specifically shown in FIG. 1, in further embodiments, the UDC circuit 140 may further include a balancer, e.g., in each of the TX and RX paths, configured to mitigate imbalances in the in-phase and quadrature (IO) signals due to mismatching. Furthermore, although also not specifically shown in FIG. 1, in further embodiments, a respective filter may be implemented at the output of the mixers 144, 148, to filter out undesired frequency components resulting from the frequency mixing. Still further, although also not specifically shown in FIG. 1, in other embodiments, the antenna apparatus 100 may include further instances of a combination of the antenna array 110, the beamformer array 120, and the UDC circuit 140 as described herein.

The antenna apparatus 100 can steer an electromagnetic radiation pattern of the antenna array 110 in a particular direction, thereby enabling the antenna array 110 to generate a main beam in that direction and side lobes in other directions. The main beam of the radiation pattern is generated based on constructive inference of the transmitted RF signals based on the transmitted signals' phases. The side lobe levels may be determined by the amplitudes of the RF signals transmitted by the antenna elements. The antenna apparatus 100 can generate desired antenna patterns by providing phase shifter settings for the antenna elements 112, e.g., using the phase shifters of the beamformers 122 and/or phase shifting performed in digital domain.

Example VGAs with Cross-Couple Switching Arrangements

Figure 6:
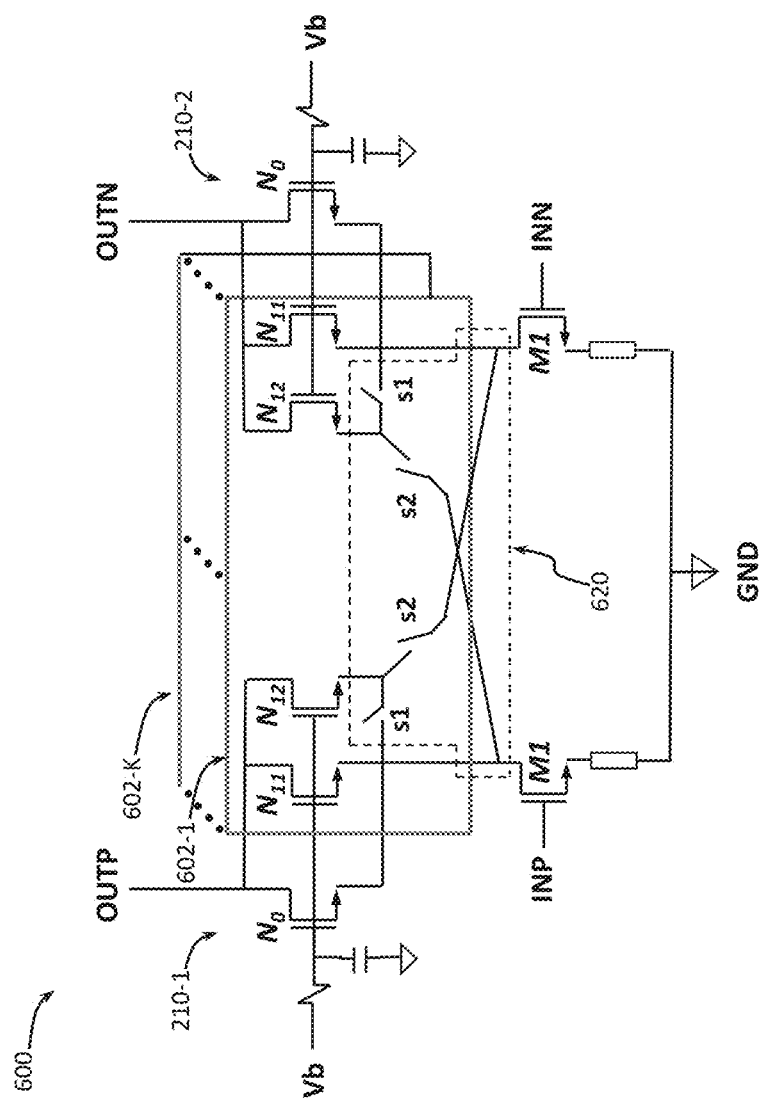
FIG. 6 provides an electric circuit diagram of a VGA with multiple gain step circuits and an example cross-couple switching arrangement, according to some embodiments of the present disclosure.

As described above, in various embodiments, VGAs with cross-couple switching arrangements, proposed herein, may be implemented using N-type or P-type transistors. Furthermore, in various embodiments, a cross-couple switching arrangement may be implemented either on the input side or the output side of a VGA. As used herein, a cross-couple switching arrangement may be described as "implemented on the input side" of a VGA if the cross-couple switching arrangement is configured to change the coupling between some of the transistors (in particular, the terminals referred to herein as "second terminals" of some of the transistors) and the differential input terminals of a VGA. On the other hand, a cross-couple switching arrangement may be described as "implemented on the output side" of a VGA if the cross-couple switching arrangement is configured to change the coupling between some of the transistors (in particular, the terminals referred to herein as "first terminals" of some of the transistors) and the differential output terminals of a VGA. Various examples of N-type or P-type transistors and cross-couple switching arrangements implemented on the input or the output sides of a VGA with a single gain step circuit are shown in FIGS. 2-5. An example VGA with multiple gain step circuits is shown in FIG. 6.

In general, as used herein, the term "switching arrangement" (e.g., a cross-couple switching arrangement 220 shown in some of the present drawings) may include any suitable switching arrangement (e.g., any suitable combination of switches) that allows ensuring that the switching functionality as described is performed. One example embodiment of the cross-couple switching arrangement 220 is illustrated in FIG. 6, described below, but various embodiments of the present disclosure are not limited to this implementation.

Figure 2B:
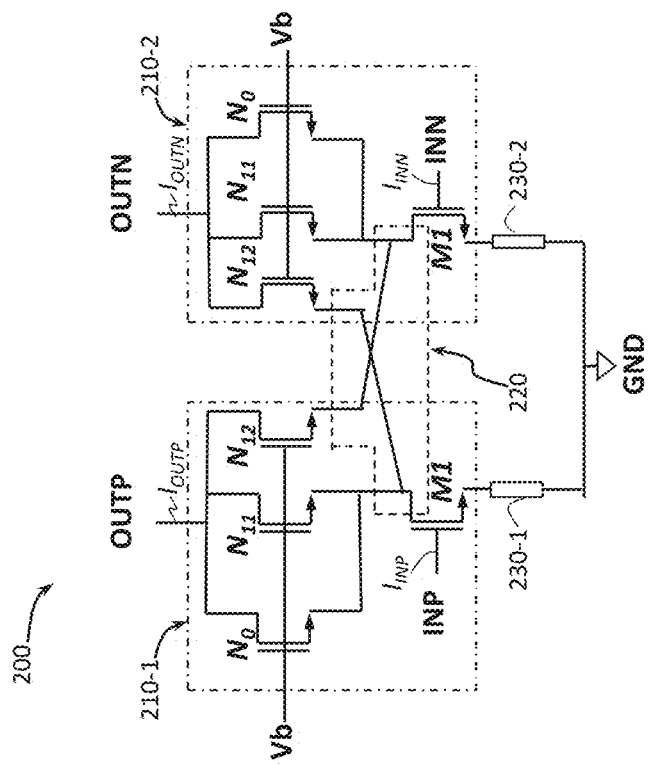
FIGS. 2A and 2B provide electric circuit diagrams of, respectively, an ON state and an OFF state of a VGA with a transistor arrangement implemented using N-type transistors and a cross-couple switching arrangement implemented on the input side, according to some embodiments of the present disclosure.
Figure 2A:
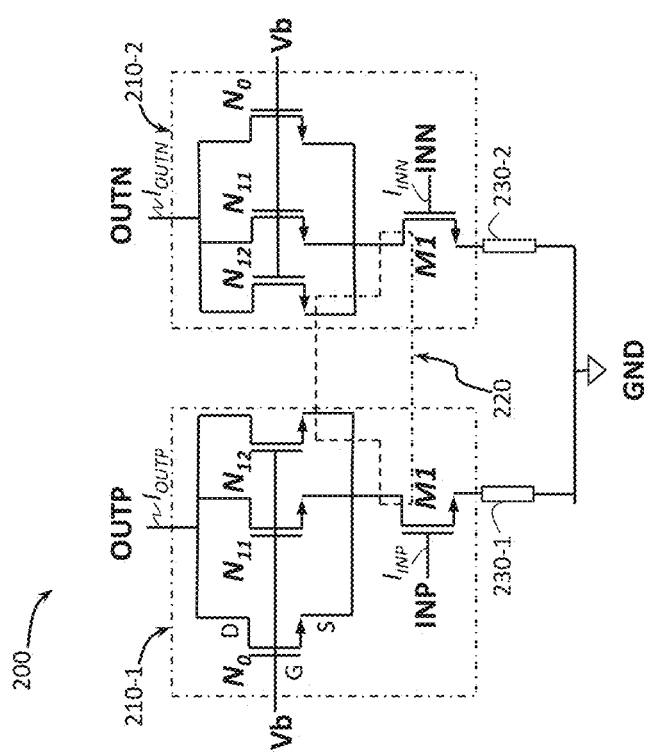

FIGS. 2A and 2B provide electric circuit diagrams of, respectively, an ON state and an OFF state of a VGA 200 with a transistor arrangement 210 implemented using a plurality of N-type transistors and a cross-couple switching arrangement 220 implemented on the input side, according to some embodiments of the present disclosure.

As shown in FIG. 2, the VGA 200 may have a differential architecture in that it the transistor arrangement 210 may have two portions—a first transistor arrangement portion 210-1 (referred to in the following simply as a "first portion 210-1") and a second transistor arrangement portion 210-2 (referred to in the following simply as a "second portion 210-2"), each portion 210 including a plurality of transistors shown in FIG. 2 within a respective dash-dotted contour. The VGA 200 may be configured to receive a differential input signal at differential input terminals of the VGA labeled as a first differential input terminal INP and a second differential input terminal INN. For example, in some embodiments, the first portion 210-1 may receive an input signal in the form of a first input voltage $V_{INP}$ that is based on a sum of a bias voltage VB for the transistor arrangement 210 and an input signal voltage $V_{IN}$ (e.g., $V_{INP}$=VB+$V_{IN}$), while the second portion 210-2 may receive the input signal in the form of a second input voltage $V_{INN}$ that is based on a difference between the bias voltage VB and the signal voltage $V_{IN}$ (e.g., $V_{INN}$=VB−$V_{IN}$). Thus, each of the first and second portions 210-1, 210-2 is associated with a respective (i.e., different) input terminal INP, INN, respectively, for receiving a respective differential input signal.

In some embodiments, the VGA 200 may be configured to output a differential output signal at differential output terminals of the VGA labeled as a first differential output terminal OUTP and a second differential output terminal OUTN. For example, in some embodiments, the first portion 210-1 may be configured to generate a first differential output current $I_{OUTP}$, while the second portion 210-2 may be configured to generate a second differential output current $I_{OUTN}$. Thus, each of the first and second portions 210-1, 210-2 is associated with a respective (i.e., different) output terminal OUTP, OUTN, respectively, for receiving a respective differential output signal. Although not specifically shown in FIG. 2 and in other illustrations of the VGAs with cross-couple switching arrangements described herein, in some embodiments, the VGA 200 may further include a differential-to-single-ended transformer configured to transform the differential output signals of the first and second portions 210-1, 210-2 into a single-ended output.

The example shown in FIGS. 2A-2B illustrates the N-type transistors of the transistor arrangement 210 as N-type FETs (e.g., NMOS transistors), for which drain, source, and gate terminals are labeled as, respectively, D, S, and G for one of the transistors (namely, for the transistor $N_0$ of the first portion 210-1). These terminals are not labeled for other N-type transistors shown in the present drawings since the designation of the drain, source, and gate terminals for this and all other N-type transistors shown is in accordance with a well-established convention of showing FETs in electric circuit diagrams. Since, in other embodiments, the VGA 200 may be implemented with N-type BJTs instead of FETs, the drain, source, and gate terminals of various transistors of the VGA 200 will be described in the following as, respectively first, second, and third terminals so that these descriptions could be read as applicable to corresponding collector, emitter, and base terminals of BJTs.

Turning to the details of the transistor arrangement 210, as shown in FIG. 2, each of the portions 210 may include an input transistor M1 and a pair of transistors, shown as a first transistor $N_{11}$ and a second transistor $N_{12}$, each of which may be coupled as cascode transistors to the input transistor M1. As also shown in FIG. 2, each of the portions 210 may further include a shared transistor $N_0$ that may also be coupled as a cascode transistor to the input transistor M1 of the portion. The first and second transistors $N_{11}$ and $N_{12}$ of both portions 210-1 and 210-2 may be referred to as a "gain step circuit" of the VGA 200 and, in further embodiments of the VGA 200, multiple such gain step circuits may be included in the VGA 200. In other words, although only a single instance of the first and second transistors $N_{11}$ and $N_{12}$ of the first portion 210-1 and of the first and second transistors $N_{11}$ and $N_{12}$ of the second portion 210-2 is shown in FIG. 2, in other embodiments, the VGA 200 may include multiple instances of the first and second transistors $N_{11}$ and $N_{12}$ of both portions 210-1 and 210-2, each coupled as described herein and individually controllable by the switching arrangement 220 to operate in the first or second mode as described herein.

As is seen by examining the differences between FIGS. 2A and 2B, the coupling of the transistors $N_0$, $N_{11}$, and M1 with respect to one another remains the same irrespective of whether the VGA 200 is in an ON state or an OFF state. On the other hand, the coupling of the transistor N12 depends on whether the VGA 200 is in an ON or an OFF state, which coupling may be changed by means of the cross-couple switching arrangement 220.

More specifically, for both ON and OFF states of the VGA 200, as shown in FIG. 2, for each of the portions 210, the first terminal (e.g., a drain terminal) of each of the transistors $N_0$, $N_{11}$, and $N_{12}$ may be coupled to one another and, together, to the respective differential output terminal of the portion. Thus, the first terminal of each of the transistors $N_0$, $N_{11}$, and $N_{12}$ of the first portion 210-1 may be coupled to the differential output terminal OUTP, while the first terminal of each of the transistors $N_0$, $N_{11}$, and $N_{12}$ of the second portion 210-2 may be coupled to the differential output terminal OUTN.

Further for each of the portions 210, the second terminal (e.g., a source terminal) of each of the transistors $N_0$ and $N_{11}$ may be coupled to one another and, together, to the respective differential input terminal of the portion via the input transistor M1. Thus, the second terminal of each of the transistors $N_0$ and $N_{11}$ of the first portion 210-1 may be coupled to the differential input terminal INP, while the first terminal of each of the transistors $N_0$ and $N_{11}$ of the second portion 210-2 may be coupled to the differential input terminal INN. In particular, the second terminal of each of the transistors $N_0$ and $N_{11}$ of the first portion 210-1 may be coupled to the first terminal of the input transistor M1 of the first portion 210-1 and the third terminal (e.g., a gate terminal) of the input transistor M1 of the first portion 210-1 may be coupled to the differential input terminal INP. Thus, the first input voltage $V_{INP}$ may be configured to be applied to the third terminal of the input transistor M1 of the first portion 210-1. Similarly, the second terminal of each of the transistors $N_0$ and $N_{11}$ of the second portion 210-2 may be coupled to the first terminal of the input transistor M1 of the second portion 210-2 and the third terminal of the input transistor M1 of the second portion 210-2 may be coupled to the differential input terminal INN. Thus, the second input voltage $V_{INN}$ may be configured to be applied to the third terminal of the input transistor M1 of the second portion 210-2.

For both ON and OFF states of the VGA 200, the second terminals of the transistors M1 of the first and second portions 210 may be coupled to a ground (GND) voltage, labeled in the present drawings as GND, possibly via a respective intermediate component 230-1, 230-2, e.g., a respective resistor.

Still further for each of the portions 210, for both ON and OFF states of the VGA 200, the third terminal of each of the transistors $N_0$, $N_{11}$, and $N_{12}$ may be coupled to one another and, together, to a bias voltage Vb. In some embodiments, the transistors $N_0$, $N_{11}$, and $N_{12}$ of both portions 210 may be coupled to the same bias voltage Vb. In other embodiments, individual bias voltages may be provided to at least some of the transistors $N_0$, $N_{11}$, and $N_{12}$ of the first and second portions 210-1, 210-2.

The differences between the ON and OFF states of the VGA 200 arise in the coupling of the second terminals of the transistors $N_{12}$ in each of the portions 210. To that end, the switching arrangement 220 is configured to operate the second transistors $N_{12}$ of the portions 210 either in a first mode (corresponding to the ON state of the VGA 200, as described below) or a second mode (corresponding to the OFF state of the VGA 200, as described below).

In the first mode, the switching arrangement 220 is configured to couple the second terminal of the second transistor $N_{12}$ of the first portion 210-1 to the differential input terminal INP associated with the first portion 210-1 and to couple the second terminal of the second transistor $N_{12}$ of the second portion 210-2 to the differential input terminal INN associated with the second portion 210-2, as shown in FIG. 2A. In such a configuration, for each of the portions 210, the currents (e.g., alternating current (AC) currents) through the transistors $N_{11}$ and $N_{12}$ may add in-phase, thereby increasing the total current at a load (which may be coupled to the output of the VGA 200, e.g., to the differential output terminals of the VGA 200). For example, in the first mode, the currents through the transistors $N_{11}$ and $N_{12}$ of the first portion 210-1 may add in-phase, thereby increasing the total output current $I_{OUTP}$, where the output current $I_{OUTP}$ may be based on (e.g., may be based on a sum on) the currents through the transistors $N_0$, $N_{11}$, and $N_{12}$ of the first portion 210-1. In this context, the total output current $I_{OUTP}$ is described as "increased" (or "decreased", for the second mode) compared to a sum of DC currents of the transistors $N_0$, $N_{11}$, and $N_{12}$ of the first portion 210-1 and AC currents of the transistors $N_0$ and $N_{11}$ of the first portion 210-1, or, alternatively, the total output current $I_{OUTP}$ may be described as "increased" (or "decreased", for the second mode) if the AC portion of the total output current $I_{OUTP}$ is increased (or decreased, for the second mode) compared to the AC currents of the transistors $N_0$ and $N_{11}$ of the first portion 210-1. Similarly, in the first mode, the currents through the transistors $N_{11}$ and $N_{12}$ of the second portion 210-2 may add in-phase, thereby increasing the total output current $I_{OUTN}$, where the output current $I_{OUTN}$ may be based on (e.g., may be based on a sum on) the currents through the transistors $N_0$, $N_{11}$, and $N_{12}$ of the second portion 210-2. In this context, the total output current $I_{OUTN}$ is described as "increased" (or "decreased", for the second mode) compared to a sum of DC currents of the transistors $N_0$, $N_{11}$, and $N_{12}$ of the second portion 210-2 and AC currents of the transistors $N_0$ and $N_{11}$ of the second portion 210-2, or, alternatively, the total output current $I_{OUTN}$ may be described as "increased" (or "decreased", for the second mode) if the AC portion of the total output current $I_{OUTN}$ is increased (or decreased, for the second mode) compared to the AC currents of the transistors $N_0$ and $N_{11}$ of the second portion 210-2. Because the total output current is increased, the gain is increased, allowing the gain step circuit of the transistors $N_{11}$ and $N_{12}$ of the first and second portions 210-1, 210-2 to apply its maximum gain to the input signal, e.g., $V_{IN}$ to generate the output signal $I_{OUT}$. Thus, the first mode corresponds to the ON state of the gain step circuit of the VGA 200.

In the second mode, the switching arrangement 220 is configured to couple the second terminal of the second transistor $N_{12}$ of the first portion 210-1 to the differential input terminal INN associated with the second portion 210-2 and to couple the second terminal of the second transistor $N_{12}$ of the second portion 210-2 to the differential input terminal INP associated with the first portion 210-1, as shown in FIG. 2B. This cross-coupling of the second terminals of the transistors $N_{12}$ of each of the portions 210 to the differential input terminals of the other portion is the reason why the switching arrangement 220 is referred to as a "cross-couple" switching arrangement. In such a configuration, for each of the portions 210, the current (e.g., AC currents) through the transistor $N_{12}$ from the other portion may subtract from the currents through the transistors $N_0$ and $N_{11}$ of the portion, thereby decreasing the total current of the portion. For example, in the second mode, the total output current $I_{OUTP}$ may be based on (e.g., may be based on a sum on) the currents through the transistors $N_0$ and $N_{11}$ of the first portion 210-1 and the current through the transistor $N_{12}$ of the second portion 210-2, where, due to the nature of the differential architecture of the VGA 200, the latter current will be subtracted from the currents through the transistors $N_0$ and $N_{11}$ of the first portion 210-1, thus decreasing the total output current $I_{OUTP}$. Similarly, in the second mode, the total output current $I_{OUTN}$ may be based on (e.g., may be based on a sum on) the currents through the transistors $N_0$ and $N_{11}$ of the second portion 210-2 and the current through the transistor $N_{12}$ of the first portion 210-1, where, due to the nature of the differential architecture of the VGA 200, the latter current will be subtracted from the currents through the transistors $N_0$ and $N_{11}$ of the second portion 210-2, thus decreasing the total output current $I_{OUTN}$. Because the total output current is decreased, the gain is decreased, allowing the gain step circuit of the transistors $N_{11}$ and $N_{12}$ of the first and second portions 210-1, 210-2 to apply its minimum gain to the input signal $V_{IN}$ to generate the output signal OUT. Thus, the second mode corresponds to the OFF state of the gain step circuit of the VGA 200.

At the design time, in order to control the amount of gain increase or decrease provided by a gain step circuit in the first or second mode of operation, first and second transistors $N_{11}$ and $N_{12}$ may be sized equally (i.e., may be of substantially the same dimensions), since the increase in gain may be determined by the ratio between the cumulative size of the transistors $N_{11}$ and $N_{12}$ and the size of transistor $N_0$. For example, if the transistors $N_0$, $N_{11}$ and $N_{12}$ are FETs, then their channel widths will have an effect on the amount of currents conducted between their source and drain terminals. At the minimum gain state the total AC current $I_{OUTP}$ or $I_{OUTN}$ may be substantially equal to the current of the respective transistor $N_0$, while, in order to increase the gain, the AC currents in the transistors $N_0$, $N_{11}$ and $N_{12}$ will be added up together. Thus the channel widths of the transistors $N_{11}$ and $N_{12}$ relative to the channel width of the transistor $N_0$ may determine the amount of increase in AC currents and, therefore, determine the amount of increase in gain. In another example, if the transistors $N_0$, $N_{11}$ and $N_{12}$ are BJTs, then their emitter areas will have an effect on the amounts of currents conducted between their emitter and collector terminals. At the minimum gain state the total AC current $I_{OUTP}$ or $I_{OUTN}$ may be substantially equal to the current of the respective transistor $N_0$, while, in order to increase the gain, the AC currents in the transistors $N_0$, $N_{11}$ and $N_{12}$ will be added up together. Thus the emitter areas of the transistors $N_{11}$ and $N_{12}$ relative to the emitter area of the transistor $N_0$ may determine the amount of increase in AC currents and, therefore, determine the amount of increase in gain.

If more than one gain step circuit is implemented in the VGA 200 (not specifically shown in FIG. 2, but an example of which is shown in FIG. 6), then the differential input terminals INP and INN, the differential output terminals OUTP and OUTN, the input transistors M1 of the first and second portions 210, and the shared transistors $N_0$ of the first and shared portions 210 may be common to all of the gain step circuits. On the other hand, the first and second transistors $N_{11}$ and $N_{12}$ of the first and second portions 210-1, 210-2 would be implemented once for each gain step circuit, and the switching circuit 220 would be configured to control the coupling of the second terminal of the transistor $N_{12}$ of the first and second portions 210-1, 210-2 as described herein to realize an ON state or an OFF state of the gain step circuit.

As the foregoing description illustrates, both in the ON state and in the OFF state of the VGA 200, all of the transistors of the transistor arrangement 210 are ON in that they conduct currents that contribute to the output currents $I_{OUTP}$ and $I_{OUTN}$. Eliminating the need to turn the cascode transistors $N_{11}$ and $N_{12}$ ON and OFF, or changing the DC current of the input transistors M1, may advantageously ensure that a substantially constant capacitance may be maintained at all VGA nodes regardless of the gain state(s) of one or more of the gain step circuits of the VGA 200, enabling a highly linear, wideband operation without having to resort to significant trade-offs with other performance parameters to achieve constant phase response. Such operation is in stark contrast to some conventional implementations where cascode transistors of individual gain step circuits may be turned ON or OFF by applying a corresponding control signal to the third terminals of such transistors to effect either an ON state or an OFF state of each of the gain step circuits. Thus, another difference of the VGA 200 from such conventional implementations is which terminal of the cascode transistors is affected by the control signal indicating whether a given gain step circuit is to be operated in an ON or an OFF state. Namely, the switching arrangement 220 may be configured to receive control signals controlling the gain states of each of the gain step circuits, and then couple the second terminal of the transistors $N_{12}$ either to the input terminals of their own portions of the differential transistor arrangement of the VGA 200 to realize the ON state operation or to the input terminals of the other portions of the differential transistor arrangement of the VGA 200 to realize the OFF state operation. Thus, in the VGA 200, the control signal indicating whether a given gain step circuit is to be operated in an ON or an OFF state is effectively applied to the second terminal of the transistors $N_{12}$ in each of the portions 210. Using the cross-couple switching arrangement 220 as described herein, together with implementing a pair of first and second transistors $N_{11}$ and $N_{12}$ in each of the differential portions 210, provides an inherently low phase error across gain states without the need for any phase compensation techniques.

Figures 3A, 3B:
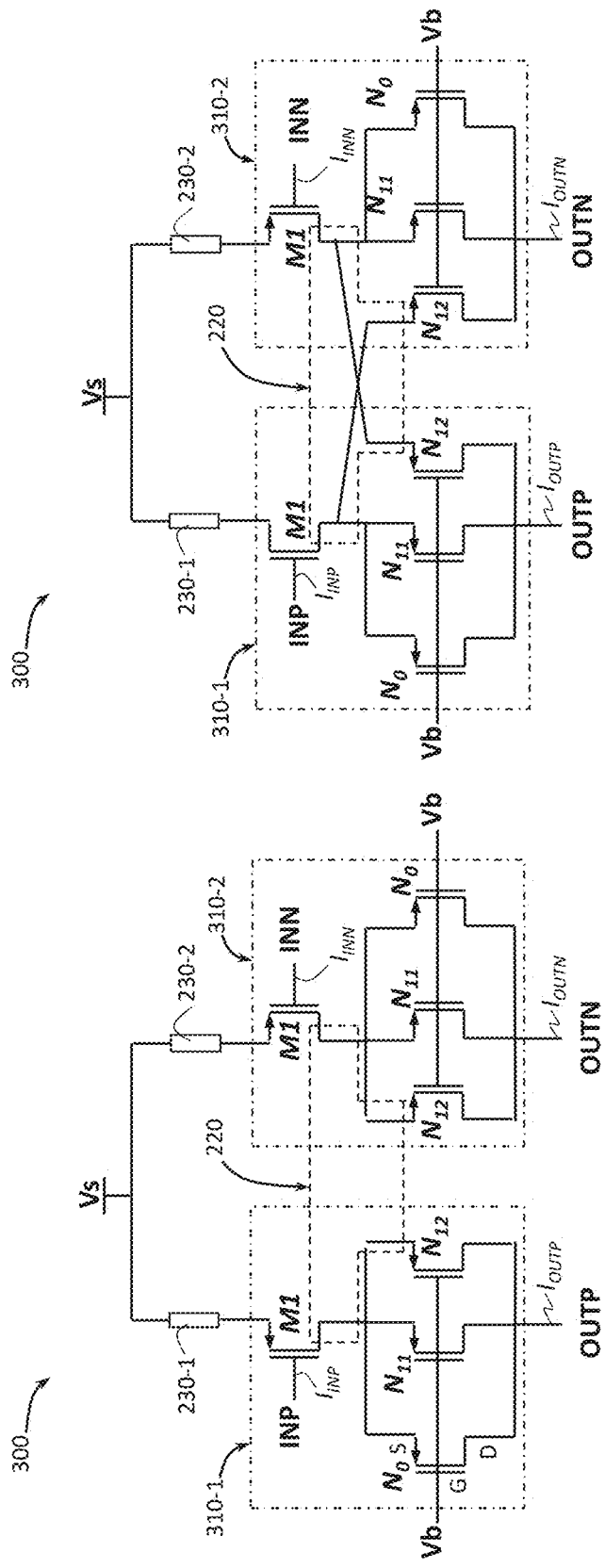
FIGS. 3A and 3B provide electric circuit diagrams of, respectively, an ON state and an OFF state of a VGA with a transistor arrangement implemented using P-type transistors and a cross-couple switching arrangement implemented on the input side, according to some embodiments of the present disclosure.

FIGS. 3A and 3B provide electric circuit diagrams of, respectively, an ON state and an OFF state of a VGA 300 with a transistor arrangement 310 implemented using P-type transistors and the cross-couple switching arrangement 230 implemented on the input side, according to some embodiments of the present disclosure. The transistor arrangement 310 of the VGA 300 is analogous to the transistor arrangement 210 of the VGA 200 except that each N-type transistor of the transistor arrangement 210 (i.e., transistors $N_0$, $N_{11}$, $N_{12}$, and M1 of the first and second portions 210-1, 210-2) is replaced with a P-type transistor (e.g., a PMOS transistor) in the transistor arrangement 310 (i.e., transistors $N_0$, $N_{11}$, $N_{12}$, and M1 of the first and second portions 310-1, 310-2 are P-type transistors). The cross-couple switching arrangement 220 used in the VGA 300 may be substantially the same as that used in the VGA 200, as far as which transistor terminals it is configured to couple in first and second modes of operation.

In the P-type transistor embodiment of FIG. 3, the descriptions provided with reference to FIG. 2 are applicable to the VGA 300 except that N-type and P-type transistors are swapped, and, consequently, supply and current directions are reversed (i.e., instead of being coupled to the ground GND, the second terminal of the input transistors M1 in each of the first and second portions 210 is coupled to a supply voltage Vs). The designations such as "first/drain terminals," "second/emitter terminals," and "third/gain terminals" remain the same. The reference letters D, S, and G, indicating the transistor terminals of example N-type FETs shown in FIG. 2 are also illustrated for one of the example P-type FETs shown in FIG. 3. In the interests of brevity, a detailed description of FIG. 3 is not provided because it is substantially analogous to that of FIG. 2 except for the changes identified above. In particular, analogous to FIG. 2, in the first mode of the VGA 300, the switching arrangement 220 is configured to couple the second terminal of the second transistor $N_{12}$ of the first portion 310-1 to the differential input terminal INP associated with the first portion 310-1 and to couple the second terminal of the second transistor $N_{12}$ of the second portion 310-2 to the differential input terminal INN associated with the second portion 310-2, as shown in FIG. 3A. Also analogous to FIG. 2, in the second mode of the VGA 300, the switching arrangement 220 is configured to couple the second terminal of the second transistor $N_{12}$ of the first portion 310-1 to the differential input terminal INN associated with the second portion 310-2 and to couple the second terminal of the second transistor $N_{12}$ of the second portion 310-2 to the differential input terminal INP associated with the first portion 310-1, as shown in FIG. 3B.

Figures 4A, 4B:
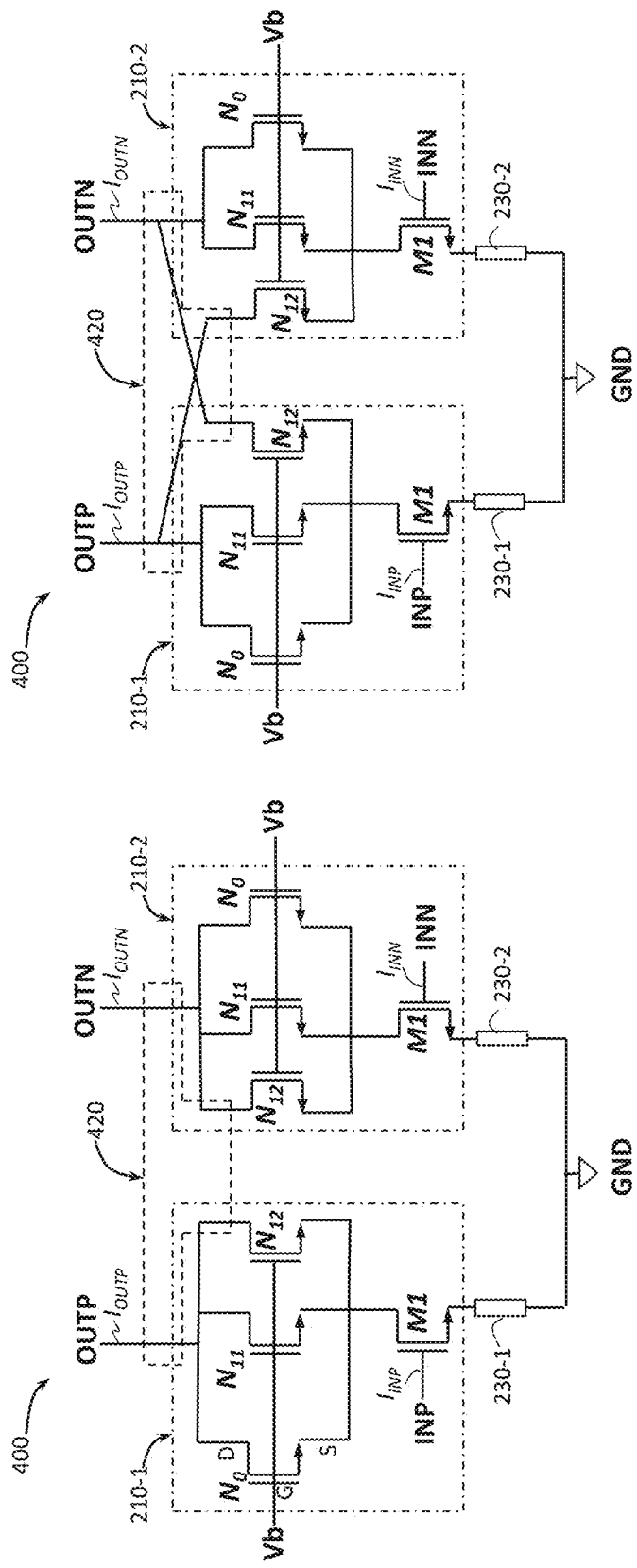
FIGS. 4A and 4B provide electric circuit diagrams of, respectively, an ON state and an OFF state of a VGA with a transistor arrangement implemented using N-type transistors and a cross-couple switching arrangement implemented on the output side, according to some embodiments of the present disclosure.

FIGS. 4A and 4B provide electric circuit diagrams of, respectively, an ON state and an OFF state of a VGA 400 with the transistor arrangement 210 implemented using N-type transistors and a cross-couple switching arrangement 420 implemented on the output side, according to some embodiments of the present disclosure. The transistor arrangement 210 of the VGA 400 may be analogous to that used in the VGA 200, except for how the second transistor $N_{12}$ is coupled, described below. The designations such as "first/drain terminals," "second/emitter terminals," and "third/gain terminals" remain the same. The reference letters D, S, and G, indicating the transistor terminals of example N-type FETs shown in FIG. 2 are also illustrated for one of the example N-type FETs shown in FIG. 4.

In particular, in both ON and OFF gain states of the VGA 400, for each of the portions 210 of the VGA 400, the second terminal (e.g., a source terminal) of the transistor $N_{12}$ is coupled to the second terminal of each of the transistors $N_0$ and $N_{11}$ and, therefore, to the respective differential input terminal of the portion via the input transistor M1. Thus, in the VGA 400, the second terminal of each of the transistors $N_0$, $N_{11}$, and $N_{12}$ of the first portion 210-1 may be coupled to the differential input terminal INP, while the first terminal of each of the transistors $N_0$, $N_{11}$, and $N_{12}$ of the second portion 210-2 may be coupled to the differential input terminal INN.

The differences between the ON and OFF states of the VGA 400 arise in the coupling of the first terminals (e.g., drain terminals) of the transistors $N_{12}$ in each of the portions 210. To that end, the switching arrangement 420 is configured to operate the second transistors $N_{12}$ of the portions 210 either in a first mode (corresponding to the ON state of the VGA 400, as described below) or a second mode (corresponding to the OFF state of the VGA 400, as described below).

In the first mode of the VGA 400, the switching arrangement 420 is configured to couple the first terminal of the second transistor $N_{12}$ of the first portion 210-1 to the differential output terminal OUTP associated with the first portion 210-1 and to couple the first terminal of the second transistor $N_{12}$ of the second portion 210-2 to the differential output terminal OUTN associated with the second portion 210-2, as shown in FIG. 4A. In such a configuration of the VGA 400, for each of the portions 210, the currents (e.g., AC currents) through the transistors $N_{11}$ and $N_{12}$ may add in-phase, thereby increasing the total current at the load (which may be coupled to the output of the VGA 400, e.g., to the differential output terminals of the VGA 400), increasing the gain, and allowing the gain step circuit of the transistors $N_{11}$ and $N_{12}$ of the first and second portions 210-1, 210-2 of the VGA 400 to apply its maximum gain to the input signal $V_{IN}$ to generate the output signal $I_{OUT}$, analogous to how it was described for the VGA 200. Thus, similar to the VGA 200, the first mode of the VGA 400 corresponds to the ON state of the gain step circuit of the VGA 400.

In the second mode of the VGA 400, the switching arrangement 420 is configured to couple the first terminal of the second transistor $N_{12}$ of the first portion 210-1 to the differential output terminal OUTN associated with the second portion 210-2 and to couple the first terminal of the second transistor $N_{12}$ of the second portion 210-2 to the differential output terminal OUTP associated with the first portion 210-1, as shown in FIG. 4B. In such a configuration of the VGA 400, for each of the portions 210, the current (e.g., AC currents) through the transistor $N_{12}$ from the other portion may subtract from the currents through the transistors $N_0$ and $N_{11}$ of the portion, thereby decreasing the total current of the portion, decreasing the gain, and allowing the gain step circuit of the transistors $N_{11}$ and $N_{12}$ of the first and second portions 210-1, 210-2 of the VGA 400 to apply its minimum gain to the input signal $V_{IN}$ to generate the output signal $I_{OUT}$, analogous to how it was described for the VGA 200. Thus, similar to the VGA 200, the second mode of the VGA 400 corresponds to the OFF state of the gain step circuit of the VGA 400.

In the interests of brevity, a detailed description of FIG. 4 is not provided because it is substantially analogous to that of FIG. 2 except for the changes identified above.

FIGS. 5A and 5B provide electric circuit diagrams of, respectively, an ON state and an OFF state of a VGA 500 with the transistor arrangement 310 implemented using P-type transistors and the cross-couple switching arrangement 420 implemented on the output side, according to some embodiments of the present disclosure.

The transistor arrangement 310 of the VGA 500 may be analogous to the transistor arrangement 310 of the VGA 300, except for how the second transistor $N_{12}$ is coupled, described below. The cross-couple switching arrangement 420 used in the VGA 500 may be substantially the same as that used in the VGA 400, as far as which transistor terminals it is configured to couple in first and second modes of operation. The designations such as "first/drain terminals," "second/emitter terminals," and "third/gain terminals" remain the same in FIG. 5 as in the other drawings. The reference letters D, S, and G, indicating the transistor terminals of example N-type FETs shown in FIG. 2 are also illustrated for one of the example P-type FETs shown in FIG. 5.

In particular, in both ON and OFF gain states of the VGA 500, for each of the portions 310 of the VGA 500, the second terminal (e.g., a source terminal) of the transistor $N_{12}$ is coupled to the second terminal of each of the transistors $N_0$ and $N_{11}$ and, therefore, to the respective differential input terminal of the portion via the input transistor M1. Thus, in the VGA 500, the second terminal of each of the transistors $N_0$, $N_{11}$, and $N_{12}$ of the first portion 310-1 may be coupled to the differential input terminal INP, while the first terminal of each of the transistors $N_0$, $N_{11}$, and $N_{12}$ of the second portion 310-2 may be coupled to the differential input terminal INN.

The differences between the ON and OFF states of the VGA 500 arise in the coupling of the first terminals (e.g., drain terminals) of the transistors $N_{12}$ in each of the portions 310. To that end, the switching arrangement 420 is configured to operate the second transistors $N_{12}$ of the portions 310 either in a first mode (corresponding to the ON state of the VGA 500, as described below) or a second mode (corresponding to the OFF state of the VGA 500, as described below).

In the first mode of the VGA 500, the switching arrangement 420 is configured to couple the first terminal of the second transistor $N_{12}$ of the first portion 310-1 to the differential output terminal OUTP associated with the first portion 310-1 and to couple the first terminal of the second transistor $N_{12}$ of the second portion 310-2 to the differential output terminal OUTN associated with the second portion 310-2, as shown in FIG. 5A. In such a configuration of the VGA 500, for each of the portions 310, the currents (e.g., AC currents) through the transistors $N_{11}$ and $N_{12}$ may add in-phase, thereby increasing the total current at the load (which may be coupled to the output of the VGA 500, e.g., to the differential output terminals of the VGA 500), increasing the gain, and allowing the gain step circuit of the transistors $N_{11}$ and $N_{12}$ of the first and second portions 310-1, 310-2 of the VGA 500 to apply its maximum gain to the input signal $V_{IN}$ to generate the output signal $I_{OUT}$, analogous to how it was described for the VGA 400. Thus, similar to the VGA 400, the first mode of the VGA 500 corresponds to the ON state of the gain step circuit of the VGA 500.

In the second mode of the VGA 500, the switching arrangement 420 is configured to couple the first terminal of the second transistor $N_{12}$ of the first portion 310-1 to the differential output terminal OUTN associated with the second portion 310-2 and to couple the first terminal of the second transistor $N_{12}$ of the second portion 310-2 to the differential output terminal OUTP associated with the first portion 310-1, as shown in FIG. 5B. In such a configuration of the VGA 500, for each of the portions 310, the current (e.g., AC currents) through the transistor $N_{12}$ from the other portion may subtract from the currents through the transistors $N_0$ and $N_{11}$ of the portion, thereby decreasing the total current of the portion, decreasing the gain, and allowing the gain step circuit of the transistors $N_{11}$ and $N_{12}$ of the first and second portions 310-1, 310-2 of the VGA 500 to apply its minimum gain to the input signal $V_{IN}$ to generate the output signal $I_{OUT}$, analogous to how it was described for the VGA 400. Thus, similar to the VGA 400, the second mode of the VGA 500 corresponds to the OFF state of the gain step circuit of the VGA 500.

In the interests of brevity, a detailed description of FIG. 5 is not provided because it is substantially analogous to that of the identified preceding drawings except for the changes identified above.

FIG. 6 provides an electric circuit diagram of a VGA 600 with multiple gain step circuits 602-1 through 602-K and an example cross-couple switching arrangement 620, according to some embodiments of the present disclosure. The example shown in FIG. 6 is similar to that shown in FIGS. 2A-2B in that N-type transistors are used in the transistor arrangement 210 and that the switching arrangement 620 is implemented on the input side. Thus, the switching arrangement 620 is an example implementation of the switching arrangement 220, described above. As shown in FIG. 6, when K gain step circuits 602 are used (where K may be any positive integer, e.g., K may be greater than 1), then each gain step circuit 602 includes a designated pair of the first and second transistors $N_{11}$ and $N_{12}$ for each of the differential portions of the transistor arrangement 210 (i.e., each gain step circuit 602 may include 4 transistors in total). The transistors $N_0$ and M1 are then coupled to each of the gain step circuits 602 (in other words, shared among multiple gain step circuits 602) as described herein.

The switching arrangement 620 illustrates that, in some embodiments, a set of 4 switches per gain step circuit 602 may be used to selectively configure each gain step circuit to operate in the first mode (i.e., ON state) or in the second mode (i.e., OFF state). For example, for the switching arrangement 620, the gain step circuit 602-1 may be configured to operate in the first mode when a switch s1 is closed and a switch s2 is open for each of the differential portions 210-1, 210-2. On the other hand, the gain step circuit 602-1 may be configured to operate in the second mode when the switch s1 is open and the switch s2 is closed for each of the differential portions 210-1, 210-2. In other embodiments, other switching arrangements may be envisioned, all being within the scope of the present disclosure.

Example RF Devices and Systems

Figure 7:
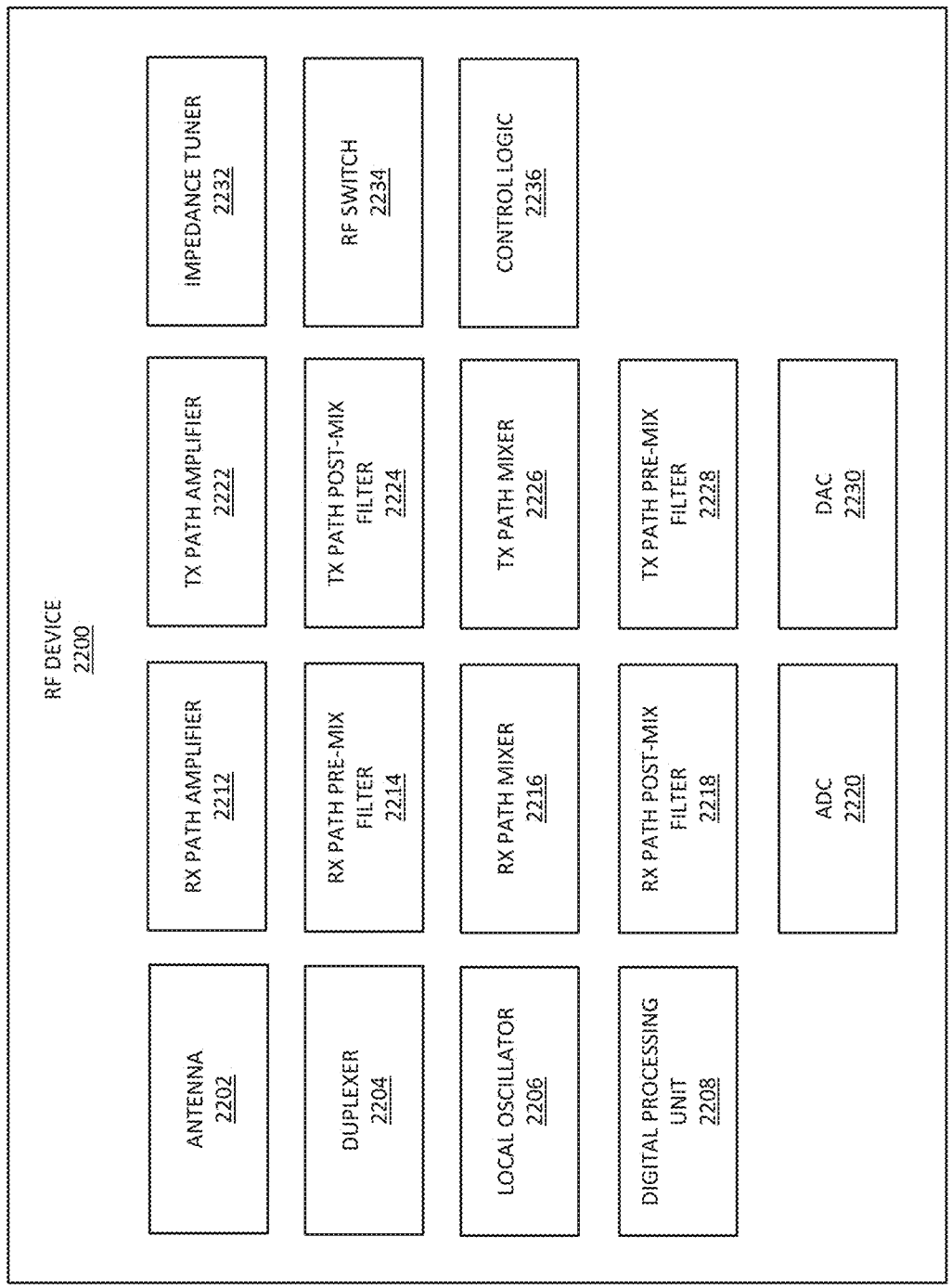
FIG. 7 provides a schematic illustration of an RF device in which one or more VGAs with cross-couple switching arrangements may be implemented, according to some embodiments of the present disclosure.

In some embodiments, VGAs with cross-couple switching arrangements as described herein may be included in various RF devices and systems used in wireless communications. For illustration purposes only, one example RF device that may include any of the VGAs with cross-couple switching arrangements described herein is shown in FIG. 7 and described below. However, in general, VGAs with cross-couple switching arrangements as described herein may be included in other devices and systems, all of which being within the scope of the present disclosure.

FIG. 7 is a block diagram of an example RF device 2200, e.g., an RF transceiver, in which one or more VGAs with cross-couple switching arrangements may be implemented, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a mm-wave wireless technology such as 5G wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as MRI.

In various embodiments, the RF device 2200 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 7 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 7, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or an LO 2206, but may include device interface circuitry (e.g., connectors and supporting circuitry) to which a digital processing unit 2208 or an LO 2206 may be coupled.

As shown in FIG. 7, the RF device 2200 may include an antenna 2202, a duplexer 2204 (e.g., if the RF device 2200 is an FDD RF device; otherwise, the duplexer 2204 may be omitted), an LO 2206, a digital processing unit 2208. As also shown in FIG. 7, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 7, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 7. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 7) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 7 as control logic 2236, e.g., an RF FE control interface. In some embodiments, the control logic 2236 may be configured to control at least portions of operating one or more VGAs with cross-couple switching arrangements. For example, the control logic 2236 may be configured to provide control signals to the cross-couple switching arrangements as described herein to indicate which gain step circuits should be in an ON state and which gate step circuits should be in an OFF state at a given time. In another example, the control logic 2236 may be configured to directly control the switches of the cross-couple switching arrangements as described herein to place individual gain step circuits in an ON state or in an OFF state. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wideband antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more LOs 2206, configured to provide LO signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 7, in some embodiments, the RF device 2200 may further include a memory device, configured to cooperate with the digital processing unit 2208.

Turning to the details of the RX path that may be included in the RF device 2200, in some embodiments, the RX path amplifier 2212 may include an LNA. In some embodiments, the RX path amplifier 2212 may include a VGA with a cross-couple switching arrangement according to any embodiments of the present disclosure. An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive LO signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with an LO signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using LO signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 7, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the LO signal provided by the LO 2206. The second RX path mixer may be configured for performing downconversion to generate a quadrature (Q) downconverted RX signal by mixing the RX signal received by the antenna 2202 and a quadrature component of the LO signal provided by the LO 2206 (the quadrature component is a component that is offset, in phase, from the in-phase component of the LO signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path LO signal provided from the LO 2206 (in various embodiments, the LO 2206 may include a plurality of different local oscillators or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

In some embodiments, the TX path amplifier 2222 may include one or more PAs, e.g., the array 330 of the PAs 332. In some embodiments, the TX path amplifier 2222 may include a VGA with a cross-couple switching arrangement according to any embodiments of the present disclosure.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters ON and OFF (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 7, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters ON and OFF) of the RF device 2200. Typically, an RF system would include a plurality of such RF switches.

The RF device 2200 provides a simplified version and, in further embodiments, other components not specifically shown in FIG. 7 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

Figure 8:
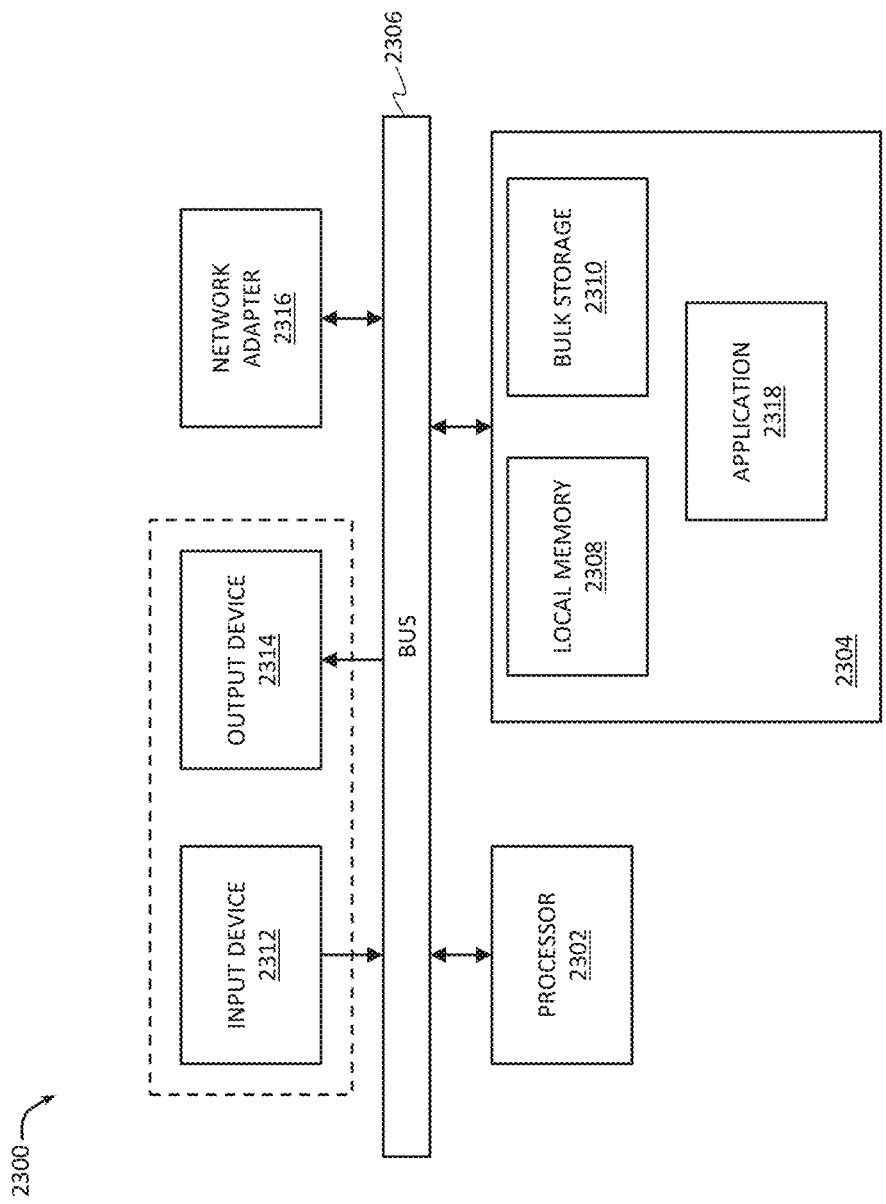
FIG. 8 provides a block diagram illustrating an example data processing system that may be configured to implement, or control, at least portions of operating a VGA with a cross-couple switching arrangement, according to some embodiments of the present disclosure.

FIG. 8 provides a block diagram illustrating an example data processing system 2300 that may be configured to control operation of one or more VGAs with cross-couple switching arrangements as described herein, according to some embodiments of the present disclosure. For example, the data processing system 2300 may be configured to implement or control portions of operating one or more VGAs with cross-couple switching arrangements as described with reference to FIGS. 1-7. In some embodiments, the data processing system 2300 may be configured to implement at least portions of the control logic 2236, shown in FIG. 7.

As shown in FIG. 8, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to operating one or more VGAs with cross-couple switching arrangements as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating VGAs with cross-couple switching arrangements as shown in FIGS. 1-7, can also include suitable interfaces for receiving, transmitting, and/or otherwise communicating data or information in a network environment so that they can communicate with, e.g., the data processing system 2300.

In certain example implementations, mechanisms operating VGAs with cross-couple switching arrangements as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 8, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 8) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 8 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

SELECT EXAMPLES

The following paragraphs provide various examples of the embodiments disclosed herein.

Example 1 provides a VGA configured to receive a differential input signal and generate an output signal based on the differential input signal and the desired gain. The VGA includes a transistor arrangement, including a plurality of transistors, each transistor having a first terminal, a second terminal, and a third terminal; and a switching arrangement, where the transistor arrangement includes a first portion and a second portion (e.g., the positive (P) and negative (N) sides of the differential circuit), each portion associated with (e.g., coupled to, or having) a respective (i.e., different) differential input terminal for receiving a respective differential input signal (e.g., the first portion is coupled to a differential input terminal INP, described herein, and is configured to receive a first differential input signal (e.g., a voltage signal $V_{INP}$ that is based on a sum of a bias voltage VB for the transistor arrangement and an input voltage signal $V_{IN}$, e.g., $V_{INP}=VB+V_{IN}$), while the second portion is coupled to a differential input terminal INN, described herein, and is configured to receive a second differential input signal (e.g., a voltage signal $V_{INN}$ that is based on a difference between the bias voltage VB for the transistor arrangement and the input voltage signal $V_{IN}$, e.g., $V_{INN}=VB-V_{IN}$)). Furthermore, the plurality of transistors of the transistor arrangement includes a first transistor (e.g., a transistor $N_{11}$, described herein) and a second transistor (e.g., a transistor $N_{12}$, described herein) in each portion. Still further, the switching arrangement is configured to operate the first and second transistors of each portion in a first mode or in a second mode, where, in the first mode, the second terminal of the second transistor of the first portion is coupled to the differential input terminal associated with the first portion and the second terminal of the second transistor of the second portion is coupled to the differential input terminal associated with the second portion, and, in the second mode, the second terminal of the second transistor of the first portion is coupled to the differential input terminal associated with the second portion and the second terminal of the second transistor of the second portion is coupled to the differential input terminal associated with the first portion.

Example 2 provides the VGA according to example 1, where each portion is associated with a respective differential output terminal for providing a respective differential output signal (e.g., the first portion is coupled to a differential output terminal OUTP, while the second portion is coupled to a differential output terminal OUTN, described herein), and, for each portion, the first terminal of each of the first and second transistors of the portion is coupled to the differential output terminal associated with the portion, and the second terminal of the first transistor of the portion is coupled to the differential input terminal associated with the portion.

Example 3 provides the VGA according to examples 1 or 2, where the plurality of transistors of the transistor arrangement includes an input transistor (e.g., a transistor M1, described herein) in each portion, for each portion, the second terminal of the first transistor of the portion is coupled to the differential input terminal associated with the portion via the input transistor of the portion, in the first mode, the second terminal of the second transistor of the first portion is coupled to the differential input terminal associated with the first portion via the input transistor of the first portion, and the second terminal of the second transistor of the second portion is coupled to the differential input terminal associated with the second portion via the input transistor of the second portion, and, in the second mode, the second terminal of the second transistor of the first portion is coupled to the differential input terminal associated with the second portion via the input transistor of the second portion and the second terminal of the second transistor of the second portion is coupled to the differential input terminal associated with the first portion via the input transistor of the first portion.

Example 4 provides the VGA according to any one of the preceding examples, where the plurality of transistors of the transistor arrangement includes an input transistor (e.g., a transistor M1, described herein) in each portion, and, for each portion, the second terminal of the first transistor of the portion is coupled to the differential input terminal associated with the portion by the second terminal of the first transistor of the portion being coupled to the first terminal of the input transistor of the portion and the third terminal of the input transistor of the portion being coupled to the differential input terminal associated with the portion. In the first mode, the second terminal of the second transistor of the first portion is coupled to the differential input terminal associated with the first portion by the second terminal of the second transistor of the first portion being coupled to the first terminal of the input transistor of the first portion and the third terminal of the input transistor of the first portion being coupled to the differential input terminal associated with the first portion, and the second terminal of the second transistor of the second portion is coupled to the differential input terminal associated with the second portion by the second terminal of the second transistor of the second portion being coupled to the first terminal of the input transistor of the second portion and the third terminal of the input transistor of the second portion being coupled to the differential input terminal associated with the second portion. In the second mode, the second terminal of the second transistor of the first portion is coupled to the differential input terminal associated with the second portion by the second terminal of the second transistor of the first portion being coupled to the first terminal of the input transistor of the second portion and the third terminal of the input transistor of the second portion being coupled to the differential input terminal associated with the second portion, and the second terminal of the second transistor of the second portion is coupled to the differential input terminal associated with the first portion by the second terminal of the second transistor of the second portion being coupled to the first terminal of the input transistor of the first portion and the third terminal of the input transistor of the first portion being coupled to the differential input terminal associated with the first portion.

Example 5 provides the VGA according to any one of the preceding examples, where each portion is associated with a respective differential output terminal for providing a respective differential output signal (e.g., the first portion is coupled to a differential output terminal OUTP, while the second portion is coupled to a differential output terminal OUTN, described herein), the plurality of transistors of the transistor arrangement includes a shared transistor (e.g., a transistor $N_0$, described herein) in each portion, and, for each portion, the first terminal of the shared transistor of the portion is coupled to the differential output terminal associated with the portion and the second terminal of the shared transistor of the portion is coupled to the differential input terminal associated with the portion.

Example 6 provides the VGA according to example 5, where, for each portion, the third terminal of each of the first transistor, the second transistor, and the shared transistor is coupled to one or more bias voltages.

Example 7 provides the VGA according to any one of the preceding examples, where the first and second transistors of the first portion and the first and second transistors of the second portion form a first gain step circuit, the transistor arrangement includes a plurality of gain step circuits, each of which implemented as the first gain step circuit, and the switching arrangement is configured to selectively operate the first and second transistors of each portion of each of the plurality of gain step circuits in the first mode or in the second mode.

Example 8 provides the VGA according to example 7, where the switching arrangement is configured to selectively operate the first and second transistors of each portion of each of the plurality of gain step circuits in the first mode or in the second mode based on control signals for each of the plurality of gain step circuits.

Example 9 provides the VGA according to any one of the preceding examples, where the first and second transistors of the first portion and the first and second transistors of the second portion form a first gain step circuit, the first and second modes of any of the preceding examples are, respectively, first and second modes of the first gain step circuit, the plurality of transistors of the transistor arrangement further includes a third transistor (e.g., a transistor $N_{11}$ as described herein but of the second gain step circuit) and a fourth transistor (e.g., a transistor $N_{12}$ as described herein but of the second gain step circuit) in each portion, and the third and fourth transistors of the first portion and the third and fourth transistors of the second portion form a second gain step circuit. Furthermore, the switching arrangement is configured to operate the third and fourth transistors of each portion in a first mode or in a second mode of the second gain step circuit, where, in the first mode of the second gain step circuit, the second terminal of the fourth transistor of the first portion is coupled to the differential input terminal associated with the first portion and the second terminal of the fourth transistor of the second portion is coupled to the differential input terminal associated with the second portion, and, in the second mode of the second gain step circuit, the second terminal of the fourth transistor of the first portion is coupled to the differential input terminal associated with the second portion and the second terminal of the fourth transistor of the second portion is coupled to the differential input terminal associated with the first portion.

Example 10 provides a VGA configured to receive a differential input signal and generate a differential output signal based on the differential input signal and the desired gain. The VGA includes a transistor arrangement, including a plurality of transistors, each transistor having a first terminal, a second terminal, and a third terminal; and a switching arrangement, where the transistor arrangement includes a first portion and a second portion (e.g., the positive (P) and negative (N) sides of the differential circuit), each portion associated with (e.g., coupled to, or having) a respective (i.e., different) differential output terminal for providing a respective differential output signal (e.g., the first portion is coupled to a differential output terminal OUTP, while the second portion is coupled to a differential output terminal OUTN, described herein), and the plurality of transistors of the transistor arrangement includes a first transistor (e.g., a transistor $N_{11}$, described herein) and a second transistor (e.g., a transistor $N_{12}$, described herein) in each portion. Furthermore, the switching arrangement is configured to operate the first and second transistors of each portion in a first mode or in a second mode, where, in the first mode, the first terminal of the second transistor of the first portion is coupled to the differential output terminal associated with the first portion and the first terminal of the second transistor of the second portion is coupled to the differential output terminal associated with the second portion, and, in the second mode, the first terminal of the second transistor of the first portion is coupled to the differential output terminal associated with the second portion and the first terminal of the second transistor of the second portion is coupled to the differential output terminal associated with the first portion.

Example 11 provides the VGA according to example 10, where each portion is associated with a respective (i.e., different) differential input terminal for receiving a respective differential input signal, and, for each portion, the second terminal of each of the first and second transistors of the portion is coupled to the differential input terminal associated with the portion, and the first terminal of the first transistor of the portion is coupled to the differential output terminal associated with the portion.

Example 12 provides the VGA according to examples 10 or 11, where the plurality of transistors of the transistor arrangement includes an input transistor (e.g., a transistor M1, described herein) in each portion, and, for each portion, the second terminal of each of the first and second transistors of the portion is coupled to the input transistor of the portion.

Example 13 provides the VGA according to example 12, where each portion is associated with a respective (i.e., different) differential input terminal for receiving a respective differential input signal (e.g., the first portion is coupled to a differential input terminal INP, described herein, and is configured to receive a first differential input signal (e.g., a voltage signal $V_{INP}$ that is based on a sum of a bias voltage VB for the transistor arrangement and an input voltage signal $V_{IN}$, e.g., $V_{INP}=VB+V_{IN}$), while the second portion is coupled to a differential input terminal INN, described herein, and is configured to receive a second differential input signal (e.g., a voltage signal $V_{INN}$ that is based on a difference between the bias voltage VB for the transistor arrangement and the input voltage signal $V_{IN}$, e.g., $V_{INN}=VB-V_{IN}$)), and, for each portion, the second terminal of each of the first and second transistors of the portion is coupled to the first terminal of the input transistor of the portion and the third terminal of the input transistor of the portion being coupled to the differential input terminal associated with the portion.

Example 14 provides the VGA according to any one of examples 10-13, where each portion is associated with a respective (i.e., different) differential input terminal for receiving a respective differential input signal, the plurality of transistors of the transistor arrangement includes a shared transistor (e.g., a transistor $N_0$, described herein) in each portion, and, for each portion, the first terminal of the shared transistor of the portion is coupled to the differential output terminal associated with the portion and the second terminal of the shared transistor of the portion is coupled to the differential input terminal associated with the portion.

Example 15 provides the VGA according to example 14, where, for each portion, the third terminal of each of the first transistor, the second transistor, and the shared transistor is coupled to one or more bias voltages.

Example 16 provides the VGA according to any one of examples 10-15, where the first and second transistors of the first portion and the first and second transistors of the second portion form a first gain step circuit, the transistor arrangement includes a plurality of gain step circuits, each of which implemented as the first gain step circuit, and the switching arrangement is configured to selectively operate the first and second transistors of each portion of each of the plurality of gain step circuits in the first mode or in the second mode.

Example 17 provides the VGA according to example 16, where the switching arrangement is configured to selectively operate the first and second transistors of each portion of each of the plurality of gain step circuits in the first mode or in the second mode based on control signals for each of the plurality of gain step circuits.

Example 18 provides the VGA according to any one of the preceding examples, where, during operation, each of the first transistor and second transistors of each portion is configured to conduct current irrespective of whether the first and second transistors of each portion are operated in the first mode or in the second mode.

Example 19 provides the VGA according to any one of the preceding examples, where, during operation, in the first mode, a current through the second transistor of the first portion and a current through the second transistor of the second portion increase a total current at a load, and, in the second mode, the current through the second transistor of the first portion and the current through the second transistor of the second portion decrease the total current at the load. In this context, the terms "increase" and "decrease" are used to refer to changes of the total current (e.g., AC current) at the load with respect to the current at the load due to AC currents in the shared transistor $N_0$ and the first transistor $N_{11}$ in the first and second portions.

Example 20 provides the VGA according to any one of examples 1-19, where each of the plurality of transistors is an N-type transistor (e.g., an NMOS or an NPN transistor).

Example 21 provides the VGA according to any one of examples 1-19, where each of the plurality of transistors is a P-type transistor (e.g., a PMOS or a PNP transistor).

Example 22 provides the VGA according to any one of examples 1-21, where each of the plurality of transistors is a FET (e.g., an NMOS or a PMOS transistor), and, for each FET, the first terminal is a drain terminal of the FET, the second terminal is a source terminal of the FET, and the third terminal is a gate terminal of the FET.

Example 23 provides the VGA according to any one of examples 1-21, where each of the plurality of transistors is a BJT (e.g., an NPN or a PNP transistor), and, for each BJT, the first terminal is a collector terminal of the BJT, the second terminal is an emitter terminal of the BJT, and the third terminal is a base terminal of the BJT.

Example 24 provides a VGA configured to receive a differential input signal and generate a differential output signal based on the differential input signal and the desired gain. The VGA includes a transistor arrangement, including a plurality of transistors; and a switching arrangement, where the transistor arrangement includes a first portion and a second portion (e.g., the positive (P) and negative (N) sides of the differential circuit), each portion associated with a respective differential input terminal for receiving a respective differential input signal and a respective differential output terminal for providing a respective differential output signal, the plurality of transistors of the transistor arrangement includes a first transistor (e.g., a transistor $N_{11}$, described herein) and a second transistor (e.g., a transistor $N_{12}$, described herein) in each portion, and the switching arrangement is configured to operate the first and second transistors of each portion in a first mode or in a second mode. Furthermore, for each portion, in the first mode, a current through the second transistor of the portion is added to a current through the first transistor of the portion, and, in the second mode, the current through the second transistor of the portion is subtracted from the current through the first transistor of the portion.

Example 25 provides the VGA according to example 24, where, during operation, each of the first transistor and second transistors of each portion is configured to conduct current irrespective of whether the first and second transistors of each portion are operated in the first mode or in the second mode.

Example 26 provides the VGA according to examples 24 or 25, where, during operation, in the first mode, a current through the second transistor of the first portion and a current through the second transistor of the second portion increase a total current at a load, and, in the second mode, the current through the second transistor of the first portion and the current through the second transistor of the second portion decrease the total current at the load.

Example 27 provides the VGA according to any one of examples 24-26, where the plurality of transistors of the transistor arrangement includes an input transistor (e.g., a transistor M1, described herein) in each portion, and, for each portion, each of the first and second transistors of the portion is coupled to the input transistor of the portion.

Example 28 provides the VGA according to example 27, where each transistor of the plurality of transistors includes a first terminal, a second terminal, and a third terminal, and where, for each portion, the first terminal of the input transistor of the portion is coupled to the second terminal of the first transistor of the portion.

Example 29 provides the VGA according to example 28, where, for each portion, the third terminal of each of the first transistor and the second transistor is coupled to one or more bias signals.

Example 30 provides the VGA according to any one of examples 24-29, where each transistor of the plurality of transistors includes a first terminal, a second terminal, and a third terminal. In such a VGA, in the first mode, the first terminal of the second transistor of the portion is coupled to the first terminal of the first transistor of the portion, and the second terminal of the second transistor of the portion is coupled to the second terminal of the first transistor of the portion, and, in the second mode, either the first terminal of the second transistor of the portion is coupled to the first terminal of the first transistor of the other portion, or the second terminal of the second transistor of the portion is coupled to the second terminal of the first transistor of the other portion.

Example 31 provides an electronic device that includes the VGA according to any one of the preceding examples.

Example 32 provides the electronic device according to example 31, where the electronic device is a beamformer of an RF transceiver.

Example 33 provides the electronic device according to example 31, where the electronic device is an RF transceiver.

Example 34 provides the electronic device according to any one of examples 31-33, where the electronic device is a base station of a wireless cellular network.

Example 35 provides the electronic device according to any one of examples 31-33, where the electronic device is a transceiver of a cable communications network.

VARIATIONS AND IMPLEMENTATIONS

While embodiments of the present disclosure were described above with references to exemplary implementations as shown in FIGS. 1-8, a person skilled in the art will realize that the various teachings described above are applicable to a large variety of other implementations. In certain contexts, the features discussed herein can be applicable to automotive systems, medical systems, scientific instrumentation, wireless and wired communications, radio, radar, and remote sensing systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to VGAs with cross-couple switching arrangements as described herein.

Parts of various systems in which one or more VGAs with cross-couple switching arrangements as proposed herein may be implemented can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-8) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to implementing VGAs with cross-couple switching arrangements as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. An electronic component, comprising:
    a transistor arrangement, comprising a plurality of transistors, each transistor having a first terminal, a second terminal, and a third terminal; and
    a switching arrangement,
    wherein:
        the transistor arrangement includes a first portion and a second portion, each of the first portion and the second portion associated with a respective differential input terminal for receiving a respective differential input signal, and further associated with a respective differential output terminal for providing a respective differential output signal,
        the plurality of transistors of the transistor arrangement includes a first transistor, a second transistor, and a shared transistor in each of the first portion and the second portion,
        the switching arrangement is to operate the first and second transistors of the first portion and the second portion in a first mode or in a second mode, where:
            in the first mode, the second terminal of the second transistor of the first portion is coupled to the differential input terminal associated with the first portion and the second terminal of the second transistor of the second portion is coupled to the differential input terminal associated with the second portion, and
            in the second mode, the second terminal of the second transistor of the first portion is coupled to the differential input terminal associated with the second portion and the second terminal of the second transistor of the second portion is coupled to the differential input terminal associated with the first portion, and
        for each portion of the first portion and the second portion, the first terminal of the shared transistor of the portion is coupled to the differential cutout terminal associated with the portion and the second terminal of the shared transistor of the portion coupled to the differential input terminal associated with the portion.

2. The electronic component according to claim 1, wherein:
    for each of the first portion end the second portion, the first terminal of each of the first and second transistors of the portion is coupled to the differential output terminal associated with the portion, and the second terminal of the first transistor of the portion is coupled to the differential input terminal associated with the portion.

3. The electronic component according to claim 1, wherein:
    the plurality of transistors of the transistor arrangement includes an input transistor in each of the first portion end the second portion,
    for each of the first portion and the second portion, the second terminal of the first transistor of the portion is coupled to the differential input terminal associated with the portion via the input transistor of the portion,
    in the first mode, the second terminal of the second transistor of the first portion is coupled to the differential input terminal associated with the first portion via the input transistor of the first portion, and the second terminal of the second transistor of the second portion is coupled to the differential input terminal associated with the second portion via the input transistor of the second portion, and
    in the second mode, the second terminal of the second transistor of the first portion is coupled to the differential input terminal associated with the second portion via the input transistor of the second portion and the second terminal of the second transistor of the second portion is coupled to the differential input terminal associated with the first portion via the input transistor of the first portion.

4. The electronic component according to claim 1, wherein:
    for each of the first portion and the second portion, the first terminal of the shared transistor of the portion is coupled to the differential output terminal associated with the portion and the second terminal of the shared transistor of the portion is coupled to the differential input terminal associated with the portion.

5. The electronic component according to claim 1, wherein:
    the first and second transistors of the first portion and the first and second transistors of the second portion form a first gain step circuit,
    the transistor arrangement includes a plurality of gain step circuits, each of which implemented as the first gain step circuit, and
    the switching arrangement is selectively operate the first and second transistors of the first portion and the second portion of each of the plurality of gain step circuits in the first mode or in the second mode.

6. The electronic component according to claim 1, wherein:
    the first and second transistors of the first portion and the first and second transistors of the second portion form a first gain step circuit,
    the first and second modes are, respectively, first and second modes of the first gain step circuit,
    the plurality of transistors of the transistor arrangement further includes a third transistor and a fourth transistor in each of the first portion and the second portion,
    the third and fourth transistors of the first portion and the third and fourth transistors of the second portion form a second gain step circuit, and
    the switching arrangement is to operate the third and fourth transistors of the first portion and the second portion in a first mode or in a second mode of the second gain step circuit, where:
        in the first mode of the second gain step circuit, the second terminal of the fourth transistor of the first portion is coupled to the differential input terminal associated with the first portion and the second terminal of the fourth transistor of the second portion is coupled to the differential input terminal associated with the second portion, and in the second mode of the second gain step circuit, the second terminal of the fourth transistor of the first portion is coupled to the differential input terminal associated with the second portion and the second terminal of the fourth transistor of the second portion is coupled to the differential input terminal associated with the first portion.

7. An electronic component, comprising:

a transistor arrangement, comprising a plurality of transistors, each transistor having a first terminal, a second terminal, and a third terminal; and a switching arrangement, wherein:

the transistor arrangement includes a first portion and a second portion, each of the first portion and the second portion associated with a respective differential input terminal for receiving a respective differential input signal, and further associated with a respective differential output terminal for providing a respective differential output signal, the plurality of transistors of the transistor arrangement includes a first transistor, a second transistor, and a shared transistor in each of the first portion and the second portion, the switching arrangement is to operate the first and second transistors of the first portion and the second portion in a first mode or in a second mode, where:

in the first mode, the first terminal of the second transistor of the first portion is coupled to the differential output terminal associated with the first portion and the first terminal of the second transistor of the second portion is coupled to the differential output terminal associated with the second portion, and in the second mode, the first terminal of the second transistor of the first portion is coupled to the differential output terminal associated with the second portion and the first terminal of the second transistor of the second portion is coupled to the differential output terminal associated with the first portion, and for each portion of the first portion and the second portion, the first terminal of the shared transistor of the portion is coupled to the differential output terminal associated with the portion and the second terminal of the shared transistor of the portion is coupled to the differential input terminal associated with the portion.

8. The electronic component according to claim 7, wherein:

for each of the first portion and the second portion, the second terminal of each of the first and second transistors of the portion is coupled to the differential input terminal associated with the portion, and the first terminal of the first transistor of the portion is coupled to the differential output terminal associated with the portion.

9. The electronic component according to claim 7, wherein:

the plurality of transistors of the transistor arrangement includes an input transistor in each of the first portion and the second portion, and for each of the first portion and the second portion, the second terminal of each of the first and second transistors of the portion is coupled to the input transistor of the portion.

10. The electronic component according to claim 9, wherein:

for each of the first portion and the second portion, the second terminal of each of the first and second transistors of the portion is coupled to the first terminal of the input transistor of the portion and the third terminal of the input transistor of the portion is coupled to the differential input terminal associated with the portion.

11. The electronic component according to claim 7, wherein:

for each of the first portion and the second portion, the first terminal of the shared transistor of the portion is coupled to the differential output terminal associated with the portion and the second terminal of the shared transistor of the portion is coupled to the differential input terminal associated with the portion.

12. The electronic component according to claim 7, wherein:

the first and second transistors of the first portion and the first and second transistors of the second portion form a first gain step circuit, the transistor arrangement includes a plurality of gain step circuits, each of which implemented as the first gain step circuit, and the switching arrangement is to selectively operate the first and second transistors of the first portion and the second portion of each of the plurality of gain step circuits in the first mode or in the second mode.

13. The electronic component according to claim 7, wherein, during operation, each of the first transistor and second transistors is to conduct current irrespective of whether the first and second transistors are operated in the first mode or in the second mode.

14. The electronic component according to claim 7, wherein, during operation:

in the first mode, a current through the second transistor of the first portion and a current through the second transistor of the second portion increase a total current at a load, and in the second mode, the current through the second transistor of the first portion and the current through the second transistor of the second portion decrease the total current at the load.

15. A electronic component, comprising:

a transistor arrangement, comprising a plurality of transistors; and a switching arrangement, wherein:

the transistor arrangement includes a first portion and a second portion, the plurality of transistors of the transistor arrangement includes a first transistor, a second transistor, and a shared transistor in each of the first portion end the second portion, and the switching arrangement is to operate the first and second transistors of each of the first portion end the second portion in a first mode or in a second mode, where, for each of the first portion and the second portion:

in the first mode, a current through the second transistor of the portion is added to a current through the first transistor of the portion, in the second mode, the current through the second transistor of the portion is subtracted from the current through the first transistor of the portion, and the first transistor, and the second transistor, and the shared transistor are coupled to same bias voltage.

16. The electronic component according to claim 15, wherein each transistor of the plurality of transistors includes a first terminal, a second terminal, and a third terminal, and wherein:

in the first mode, the first terminal of the second transistor of the portion is coupled to the first terminal of the first transistor of the portion, and the second terminal of the second transistor of the portion is coupled to the second terminal of the first transistor of the portion, and in the second mode, either the first terminal of the second transistor of the portion is coupled to the first terminal of the first transistor of the other portion, or the second terminal of the second transistor of the portion is coupled to the second terminal of the first transistor of the other portion.

17. The electronic component according to claim 1, wherein in each of the first portion and the second portion, the third terminals of the first transistor, the second transistor, and the shared transistor are coupled to same bias voltage.

18. The electronic component according to claim 1, wherein the electronic component is a variable gain amplifier.

19. The electronic component according to claim 1, wherein the electronic component is a radio frequency component.

20. The electronic component according to claim 7, wherein in each of the first portion and the second portion, the third terminals of the first transistor, the second transistor, and the shared transistor are coupled to same bias voltage.

21. The electronic component according to claim 7, wherein the electronic component is a variable gain amplifier.

22. The electronic component according to claim 7, wherein the electronic component is a radio frequency component.

23. The electronic component according to claim 15, wherein the electronic component is a variable gain amplifier.

24. The electronic component according to claim 15, wherein the electronic component is a radio frequency component.

* * * * *